(12) United States Patent
Yamazaki

(10) Patent No.: US 8,647,933 B2
(45) Date of Patent: Feb. 11, 2014

(54) METHOD FOR MANUFACTURING SEMICONDUCTOR DEVICE AND DISPLAY DEVICE

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 532 days.

(21) Appl. No.: 12/153,722

(22) Filed: May 23, 2008

(65) Prior Publication Data

US 2008/0299689 A1    Dec. 4, 2008

(30) Foreign Application Priority Data

Jun. 1, 2007    (JP) .................................. 2007-147386

(51) Int. Cl.
*H01L 21/00*    (2006.01)
*H01L 21/84*    (2006.01)

(52) U.S. Cl.
USPC ........................................... 438/158; 438/30

(58) Field of Classification Search
USPC ............................ 438/30, 149, 151, 158–159
See application file for complete search history.

(56) References Cited

U.S. PATENT DOCUMENTS

| | | | |
|---|---|---|---|
| 4,409,134 A | 10/1983 | Yamazaki | |
| 5,453,858 A | 9/1995 | Yamazaki | |
| 5,514,879 A | 5/1996 | Yamazaki | |
| 5,614,732 A | 3/1997 | Yamazaki | |
| 5,701,167 A | 12/1997 | Yamazaki | |
| 5,796,116 A | 8/1998 | Nakata et al. | |
| 5,849,601 A | 12/1998 | Yamazaki | |
| 5,859,445 A | 1/1999 | Yamazaki | |
| 5,932,302 A | 8/1999 | Yamazaki et al. | |
| 6,011,277 A | 1/2000 | Yamazaki | |
| 6,023,075 A | 2/2000 | Yamazaki | |

(Continued)

FOREIGN PATENT DOCUMENTS

| | | |
|---|---|---|
| CN | 1577028 | 2/2005 |
| EP | 0949685 A | 10/1999 |

(Continued)

OTHER PUBLICATIONS

Arai.T et al., "41.2: Micro Silicon Technology for Active Matrix OLED Display", SID Digest 07: SID International Symposium Digest of Technical Papers, pp. 1370-1373.

(Continued)

*Primary Examiner* — Calvin Choi
(74) *Attorney, Agent, or Firm* — Eric J. Robinson; Robinson Intellectual Property Law Office, P.C.

(57) ABSTRACT

It is an object to provide a method for manufacturing a display device suitable for mass production without complicating a manufacturing process of a thin film transistor. A microcrystalline semiconductor film is formed by use of a microwave plasma CVD apparatus with a frequency of greater than or equal to 1 GHz using silicon hydride or silicon halide as a source gas, and a thin film transistor using the microcrystalline semiconductor film and a display element connected to the thin film transistor are formed. Since plasma which is generated using microwaves with a frequency of greater than or equal to 1 GHz has high electron density, silicon hydride or silicon halide which is a source gas can be easily dissociated, so that mass productivity of the display device can be improved.

24 Claims, 15 Drawing Sheets

(56) References Cited

U.S. PATENT DOCUMENTS

| | | | |
|---|---|---|---|
| 6,171,674 | B1 | 1/2001 | Yamazaki et al. |
| 6,183,816 | B1 | 2/2001 | Yamazaki et al. |
| 6,252,249 | B1 | 6/2001 | Yamazaki |
| 6,271,062 | B1 | 8/2001 | Nakata et al. |
| 6,281,520 | B1 | 8/2001 | Yamazaki |
| 6,303,945 | B1 | 10/2001 | Saito et al. |
| 6,306,213 | B1 | 10/2001 | Yamazaki |
| 6,468,617 | B1 | 10/2002 | Yamazaki et al. |
| 6,635,899 | B2 | 10/2003 | Saito et al. |
| 6,737,676 | B2 | 5/2004 | Yamazaki |
| 6,794,275 | B2 | 9/2004 | Kondo et al. |
| 6,835,523 | B1 | 12/2004 | Yamazaki et al. |
| 7,001,460 | B2 | 2/2006 | Saito et al. |
| 7,067,844 | B2 | 6/2006 | Yamazaki |
| 7,098,479 | B1 | 8/2006 | Yamazaki |
| 7,115,902 | B1 | 10/2006 | Yamazaki |
| 7,183,146 | B2 | 2/2007 | Yamazaki et al. |
| 7,511,709 | B2 | 3/2009 | Koyama et al. |
| 7,648,897 | B2 | 1/2010 | Yamazaki et al. |
| 7,795,616 | B2 | 9/2010 | Yamazaki et al. |
| 7,964,452 | B2 | 6/2011 | Yamazaki et al. |
| 8,283,216 | B2 | 10/2012 | Yamazaki et al. |
| 2001/0028924 | A1* | 10/2001 | Sherman ............ 427/255.28 |
| 2004/0221809 | A1* | 11/2004 | Ohmi et al. ............ 118/715 |
| 2005/0012887 | A1* | 1/2005 | Koyama et al. ........ 349/151 |
| 2005/0022864 | A1 | 2/2005 | Fujioka et al. |
| 2005/0089648 | A1 | 4/2005 | Yamazaki et al. |
| 2006/0238132 | A1 | 10/2006 | Kitamura et al. |
| 2007/0018165 | A1 | 1/2007 | Yamazaki |
| 2007/0120785 | A1* | 5/2007 | Kimura ................ 345/82 |
| 2009/0160753 | A1 | 6/2009 | Koyama et al. |

FOREIGN PATENT DOCUMENTS

| | | |
|---|---|---|
| EP | 1505174 | 2/2005 |
| JP | 62-062073 JP | 12/1987 |
| JP | 02-053941 | 11/1990 |
| JP | 04-242724 | 8/1992 |
| JP | 04-242724 A | 8/1992 |
| JP | 04-266019 A | 9/1992 |
| JP | 06-013329 A | 1/1994 |
| JP | 06-224431 A | 8/1994 |
| JP | 08-097436 A | 4/1996 |
| JP | 11-121761 A | 4/1999 |
| JP | 11-266030 A | 9/1999 |
| JP | 2000-277439 | 10/2000 |
| JP | 2003-007629 A | 1/2003 |
| JP | 2004-014958 | 1/2004 |
| JP | 2004-241770 A | 8/2004 |
| JP | 2005-049832 | 2/2005 |
| JP | 2005-049832 A | 2/2005 |
| JP | 2005-050905 | 2/2005 |
| JP | 2005-093737 A | 4/2005 |
| JP | 2005-165309 A | 6/2005 |
| JP | 2006-259757 A | 9/2006 |
| JP | 2007-005705 | 1/2007 |
| JP | 2007-048982 | 2/2007 |
| WO | WO-2005/047967 | 5/2005 |

OTHER PUBLICATIONS

Lee.C et al., "Postdeposition Thermal Annealing and Material Stability of 75° C. Hydrogenated Nanocrystalline Silicon Plasma-Enhanced Chemical Vapor Deposition Films,", J. Appl. Phys. (Journal of Applied Physics, Aug. 4, 2005, vol. 98, pp. 034305-1-034305-7.

Lee.C et al., "Directly Deposited Nanocrystalline Silicon Thin-Film Transistors With Ultra High Mobilities," Appl. Phys. Lett. (Applied Physics Letters, Dec. 18, 2006, vol. 89, No. 25, pp. 252101-1-252101-3.

Lee.C et al., "High-Mobility Nanocrystalline Silicon Thin-Film Transistors Fabricated by Plasma-Enhanced Chemical Vapor Deposition," Appl. Phys. Lett. (Applied Physics Letters, May 24, 2005, vol. 86, pp. 222106-1-222106-3.

Lee.C et al., "High-Mobility N-Channel and P-Channel Nanocrystalline Silicon Thin-Film Transistors," IEDM 05: Technical Digest of International Electron Devices Meeting, 2005, pp. 937-940.

Lee.C et al., "How to Achieve High Mobility Thin Film Transistors by Direct Deposition of Silicon Using 13.56 MHz RF PECVD?," IEDM, 2006, pp. 295-298.

Esmaeili-Rad.M et al., "High Stability, Low Leakage Nanocrystalline Silicon Bottom Gate Thin Film Transistors for AMOLED Displays," IEEE IEDM, 2006, pp. 303-306.

Lee.H et al., "Leakage Current Mechanisms in Top-Gate Nanocrystalline Silicon Thin-Film Transistors," Appl. Phys. Lett. ( Applied Physics Letters, Feb. 28, 2008, vol. 92, pp. 083509-1-083509-3.

Esmaeili-Rad.M et al., "Absence of Defect State Creation in Nanocrystalline Silicon Thin-Film Transistors Deduced From Constant Current Stress Measurements," Appl. Phys. Lett. (Applied Physics Letters, Sep. 12, 2007, vol. 91, pp. 113511-1-113511-3.

Lee.C et al., "Stability of NC-Si:H TFTs With Silicon Nitride Gate Dielectric," IEEE Transactions on Electron Devices, 2007, vol. 54, No. 1, pp. 45-51.

Sazonov.A at al., "Low-Temperature Materials and Thin Film Transistors for Flexible Electronics," Proceedings of the IEEE, Aug. 1, 2005, vol. 93, No. 8, pp. 1420-1428.

Esmaeili-Rad.M et al., "Stability of Nanocrystalline Silicon Bottom-Gate Thin-Film Transistors With Silicon Nitride Gate Dielectric," J. Appl. Phys. (Journal of Applied Physics, Sep. 28, 2007, vol. 102, No. 6, pp. 064512-1-064512-7.

Lee.C et al., "Top-Gate TFTs Using 13.56MHz PECVD Microcrystalline Silicon," IEEE Electron Device Letters, Sep. 5, 2005, vol. 26, No. 9, pp. 637-639.

Chinese Office Action (Application No. 200810108724.2) Dated Jun. 30, 2011.

* cited by examiner

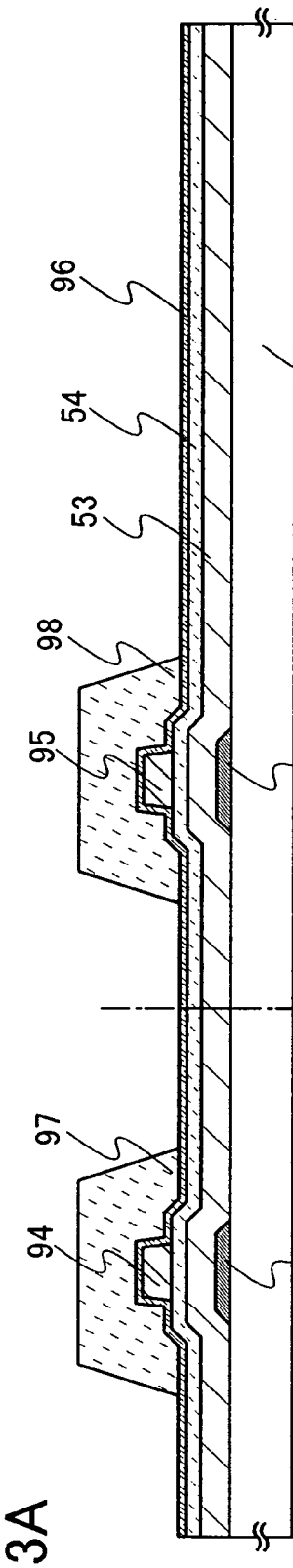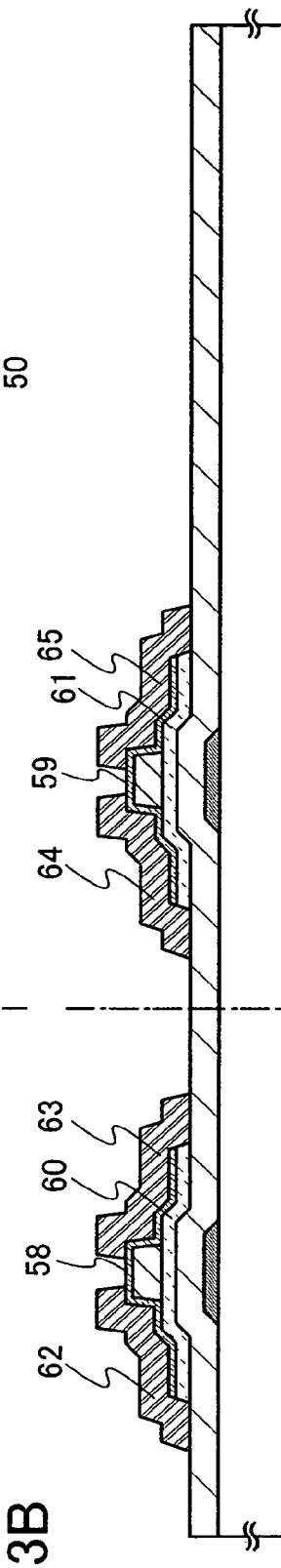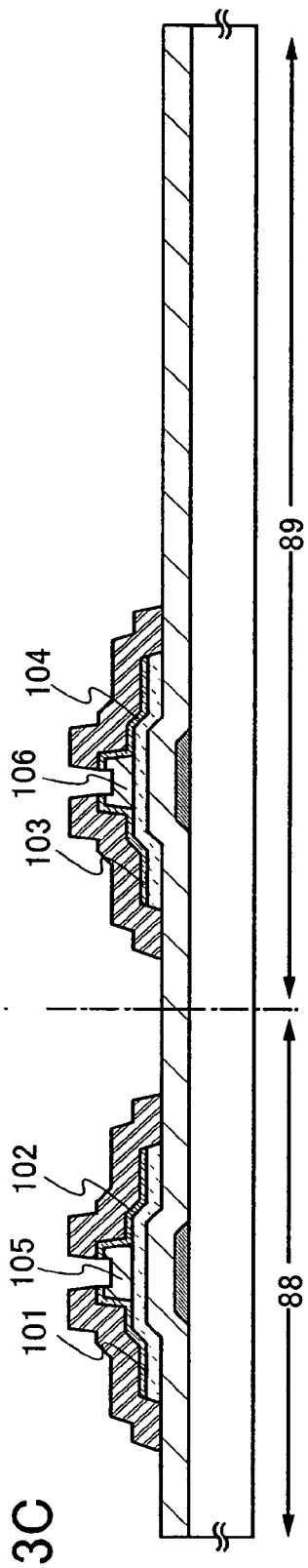

METHOD FOR MANUFACTURING SEMICONDUCTOR DEVICE AND DISPLAY DEVICE

BACKGROUND OF THE INVENTION

1. Field of the Invention

The present invention relates to a display device including a thin film transistor at least in a pixel portion.

2. Description of the Related Art

In recent years, technology that is used to form a thin film transistor using a semiconductor thin film (with a thickness of from several nanometers to several hundreds of nanometers, approximately) formed over a substrate that has an insulating surface has been attracting attention. Thin film transistors are applied to a wide range of electronic devices like ICs and electro-optical devices, and prompt development of thin film transistors that are to be used as switching elements in image display devices, in particular, is being pushed.

A thin film transistor using an amorphous semiconductor film, a thin film transistor using a polycrystalline semiconductor film, or the like is used as switching elements in image display devices.

In addition, as switching elements in image display devices, a thin film transistor using a microcrystalline semiconductor film is used (Reference 1: Japanese Published Patent Application No. H4-242724 and Reference 2: Japanese Published Patent Application No. 2005-49832).

SUMMARY OF THE INVENTION

A thin film transistor using a polycrystalline semiconductor film has an advantage that mobility is higher than that of a thin film transistor using an amorphous semiconductor film by two or more digits, and a pixel portion and a peripheral driver circuit of a semiconductor display device can be formed over the same substrate. However, the thin film transistor using a polycrystalline semiconductor film requires a more complicated process than the thin film transistor using an amorphous semiconductor film because of crystallization of the semiconductor film. Thus, there are problems such as a reduction in yield and an increase in cost.

In view of the above problems, it is an object of the present invention to provide a method for manufacturing a display device suitable for mass production without complicating a manufacturing process of a thin film transistor.

A microcrystalline semiconductor film (also referred to as a semi-amorphous semiconductor film) can be formed over a substrate directly as a microcrystalline semiconductor film, which is a different point from the case of a polycrystalline semiconductor film. Specifically, the microcrystalline semiconductor film can be formed using silicon hydride or silicon halide as a source gas by use of a microwave plasma CVD apparatus with a frequency of greater than or equal to 1 GHz. The microcrystalline semiconductor film formed by the above method also includes a microcrystalline semiconductor film which has crystal grains with a diameter of 0.5 nm to 20 nm in an amorphous semiconductor. Therefore, a crystallization process after formation of the semiconductor film is not necessary, which is different from the case of the polycrystalline semiconductor film; thus, the number of steps in manufacturing a thin film transistor can be reduced, the yield of the display device can be improved, and the cost can be suppressed. In addition, since plasma generated by using microwaves with a frequency of greater than or equal to 1 GHz has high electron density, silicon hydride or silicon halide which is a source gas can be easily dissociated.

Accordingly, compared to the case of using a microwave plasma CVD apparatus with a frequency of several tens of MHz to several hundreds of MHz, by use of a microwave plasma CVD apparatus with a frequency of greater than or equal to 1 GHz, the microcrystalline semiconductor film can be easily formed, a film-formation rate can be increased, and mass productivity of the display device can be improved.

In addition, a thin film transistor (TFT) is manufactured using the microcrystalline semiconductor film, and a display device is manufactured using the thin film transistor for a pixel portion, and further, for a driver circuit. The thin film transistor using a microcrystalline semiconductor film has a mobility of 2 $cm^2$/V·sec to 10 $cm^2$/V·sec, which is 2 to 20 times higher than that of the thin film transistor using an amorphous semiconductor film. Therefore, part of the driver circuit or the entire driver circuit can be formed over the same substrate as that of the pixel portion, so that a system-on-panel can be manufactured.

In the present invention, the microcrystalline semiconductor film is used at least in a channel formation region.

Examples of the display device include a light-emitting device and a liquid crystal display device. The light-emitting device includes a light-emitting element, and the liquid crystal display device includes a liquid crystal element. Examples of a light-emitting element include, in its category, an element whose luminance is controlled with current or voltage, specifically, an inorganic EL (electroluminescence) element, an organic EL element, an electron source element (electron-emissive element) used for an FED (field emission display), and the like.

In addition, the display device includes a panel in which a display element is sealed, and a module in which an IC and the like including a controller are mounted on the panel. The present invention further relates to one mode of an element substrate before the display element is completed in a manufacturing process of the light-emitting device, and the element substrate is provided with a means to supply current to the light-emitting element in each of a plurality of pixels. Specifically, the element substrate may be in a state provided with only a pixel electrode of the display element, a state after a conductive film to be a pixel electrode is formed and before the conductive film is etched to form the pixel electrode, or other states.

Note that a display device in this specification means an image display device, a light-emitting device, or a light source (including a lighting device). Further, the display device includes any of the following modules in its category: a module in which a connector such as an FPC (flexible printed circuit), TAB (tape automated bonding) tape, or a TCP (tape carrier package) is attached to a light-emitting device; a module having TAB tape or a TCP which is provided with a printed wiring board at the end thereof; and a module having an IC (integrated circuit) directly mounted on a light-emitting element by a COG (chip on glass) method.

In the present invention, by use of a microwave plasma CVD apparatus with a frequency of greater than or equal to 1 GHz, a film-formation rate of a microcrystalline semiconductor film can be increased, and mass productivity of a display device including a thin film transistor using the microcrystalline semiconductor film can be improved.

In addition, a crystallization process of a semiconductor film after formation of the semiconductor film can be omitted, so that a system-on-panel of the display device can be achieved without complicating a manufacturing process of the thin film transistor.

BRIEF DESCRIPTION OF THE DRAWINGS

FIGS. 3A to 3C are explanatory cross-sectional views of a method for manufacturing a display device according to the present invention.

DETAILED DESCRIPTION OF THE INVENTION

Hereinafter, embodiment modes of the present invention will be described with reference to the accompanying drawings. Note that the present invention can be implemented in various modes, and it is easily understood by those skilled in the art that modes and details thereof can be modified in various ways without departing from the spirit and the scope of the present invention. Therefore, the present invention should not be interpreted as being limited to the following description of the embodiment modes.

Embodiment Mode 1

A method for manufacturing a display device of the present invention will be described. First, the description is made using a light-emitting device that is one mode of the display device. FIGS. 1A to 3C are cross-sectional views each illustrating a thin film transistor used for a driver circuit and a thin film transistor used for a pixel portion. As for a thin film transistor in which a microcrystalline semiconductor film is used, an n-type thin film transistor has higher mobility than a p-type thin film transistor; thus, an n-type thin film transistor is more suitable for a driver circuit. However, in the present invention, either an n-type or p-type thin film transistor can be used. With any polarity of a thin film transistor, it is preferable that all the thin film transistors formed over one substrate have the same polarity so that the number of manufacturing steps is reduced.

Figure 1A:
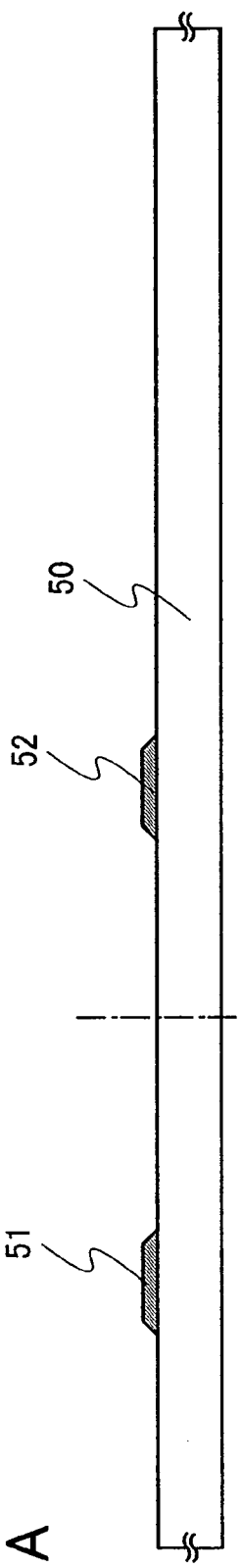
FIGS. 1A to 1C are explanatory cross-sectional views of a method for manufacturing a display device according to the present invention.

As illustrated in FIG. 1A, gate electrodes 51 and 52 are formed over a substrate 50. As the substrate 50, a plastic substrate having heat resistance that can withstand a processing temperature of a manufacturing process or the like as well as a non-alkaline glass substrate manufactured by a fusion method or a float method such as a substrate of barium borosilicate glass, an aluminoborosilicate glass, or an aluminosilicate glass, and a ceramic substrate can be used. Alternatively, a metal substrate such as a stainless steel alloy substrate, provided with an insulating layer over the surface, may also be used. As the substrate 50, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

The gate electrodes 51 and 52 are formed of a metal material such as titanium, molybdenum, chromium, tantalum, tungsten, or aluminum, or an alloy material thereof. The gate electrodes 51 and 52 can be formed as follows: a conductive film is formed over the substrate 50 by a sputtering method or a vacuum evaporation method, a mask is formed by a photolithography technique or an ink-jet method over the conductive film, and the conductive film is etched using the mask. Alternatively, the gate electrodes 51 and 52 can be formed by discharging a conductive nanopaste of silver, gold, copper, or the like by an ink-jet method and baking it. Note that a nitride film formed of the above metal material may be provided between the substrate 50 and the gate electrodes 51 and 52 to improve adherence of the gate electrodes 51 and 52 to the substrate 50.

Since semiconductor films and wirings are formed over the gate electrodes 51 and 52, the gate electrodes 51 and 52 are preferably processed to have tapered end portions so that the semiconductor films and the wirings thereover are not disconnected. Further, although not illustrated, wirings connected to the gate electrodes can also be formed at the same time when the gate electrodes are formed.

Figure 1B:
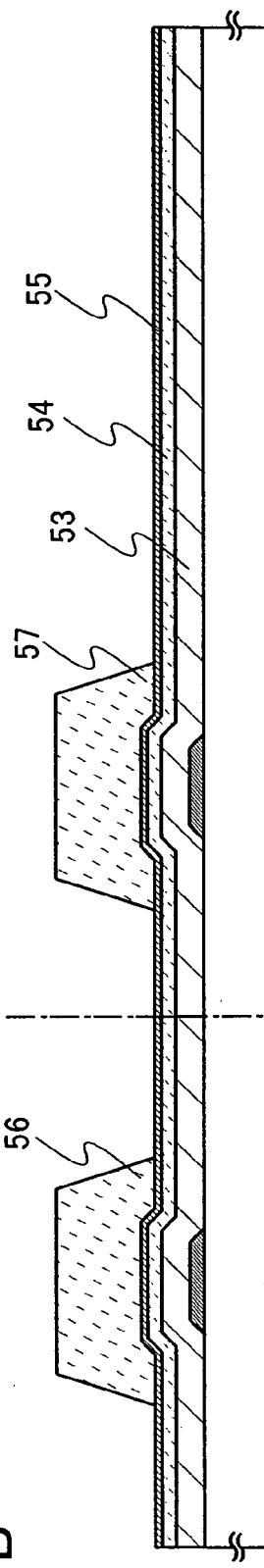

Next, as illustrated in FIG. 1B, an insulating film 53 functioning as a gate insulating film (hereinafter referred to as the insulating film 53), a microcrystalline semiconductor film 54, and a semiconductor film 55 to which an impurity element imparting one conductivity type is added (hereinafter referred to as the semiconductor film 55) are formed in order over the gate electrodes 51 and 52. Preferably, at least the insulating film 53 and the microcrystalline semiconductor film 54 are formed successively. More preferably, the insulating film 53, the microcrystalline semiconductor film 54, and the semiconductor film 55 are formed successively. When at least the insulating film 53 and the microcrystalline semiconductor film 54 are formed successively without being exposed to the atmosphere, an interface between the films can be formed without being contaminated with atmospheric components or impurity elements contained in the atmosphere. Thus, variations in characteristics of thin film transistors can be reduced.

The insulating film 53 can be formed using a single layer or stacked layers of a silicon oxide film, a silicon nitride film, a silicon oxynitride film, and/or a silicon nitride oxide film by a CVD method, a sputtering method, or the like. In addition, the insulating film 53 can be formed by stacking a silicon oxide film or a silicon oxynitride film, and a silicon nitride film or a silicon nitride oxide film in order from the substrate side. Further, the insulating film 53 can be formed by stacking a silicon nitride film or a silicon nitride oxide film, a silicon oxide film or a silicon oxynitride film, and a silicon nitride film or a silicon nitride oxide film in order from the substrate side. Furthermore, it is preferable to form the insulating film 53 by use of a microwave plasma CVD apparatus with a frequency of greater than or equal to 1 GHz. A silicon oxynitride film formed by use of a microwave plasma CVD apparatus has high resistance to voltage, so that reliability of thin film transistors formed later can be improved.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

The microcrystalline semiconductor film 54 is a film including a semiconductor having an intermediate structure between amorphous and crystalline (including single-crystalline and polycrystalline) structures. This semiconductor is in a third state which is stable in free energy and is a crystalline semiconductor having short-range order and lattice distortion, and crystal grains thereof with a diameter of 0.5 nm to 20 nm can be dispersed in an amorphous semiconductor. The semiconductor includes hydrogen or halogen of at least 1 at. % to terminate a dangling bond. Moreover, a rare gas element such as helium, argon, krypton, or neon may be included to further promote lattice distortion, so that stability is enhanced and a favorable microcrystalline semiconductor film can be obtained. Such description about a microcrystalline semiconductor film is disclosed in, for example, U.S. Pat. No. 4,409,134.

The microcrystalline semiconductor film 54 can be formed by use of a microwave plasma CVD apparatus in which microwaves with a frequency of greater than or equal to 1 GHz, preferably greater than or equal to 2.45 GHz, more preferably greater than or equal to 8.3 GHz are used. Typically, the microcrystalline semiconductor film 54 can be formed using silicon hydride such as $SiH_4$ or $Si_2H_6$, or silicon halide such as $SiCl_4$ or $SiF_4$. Alternatively, silicon hydride or silicon halide may be diluted with hydrogen; one or more rare gas elements such as helium, argon, krypton, and neon; or hydrogen and one or more rare gas elements such as helium, argon, krypton, and neon, to form the microcrystalline semiconductor film.

The microcrystalline semiconductor film 54 is formed with a thickness of 1 nm to 300 nm, inclusive, preferably 5 nm to 200 nm, inclusive.

In addition, a carbide gas such as $CH_4$ or $C_2H_6$, or a germanide gas such as $GeH_4$ or $GeF_4$ may be mixed into silicon hydride or silicon halide to adjust the width of an energy band to be 1.5 eV to 2.4 eV, or 0.9 eV to 1.1 eV.

The microcrystalline semiconductor film 54 has low n-type conductivity when an impurity element for controlling valence electrons is not added thereto intentionally. Therefore, an impurity element imparting p-type conductivity may be added to the microcrystalline semiconductor film which functions as a channel formation region of a thin film transistor at the same time as or after formation of the microcrystalline semiconductor film, so that the threshold voltage can be controlled. A typical example of the impurity element imparting p-type conductivity is boron, and an impurity gas such as $B_2H_6$ or $BF_3$ may be added to silicon hydride or silicon halide at 1 ppm to 1000 ppm, preferably 1 ppm to 100 ppm. The concentration of boron is preferably set at $1\times10^{14}$ atoms/cm$^3$ to $6\times10^{16}$ atoms/cm.

Preferably, the oxygen, nitrogen, and carbon concentrations in the microcrystalline semiconductor film are each set at less than or equal to $1\times10^{19}$ atoms/cm$^3$.

When an n-channel thin film transistor is formed, the semiconductor film 55 may be doped with phosphorus as a typical impurity element; for example, an impurity gas such as $PH_3$ may be added to silicon hydride or silicon halide. When a p-channel thin film transistor is formed, the semiconductor film 55 may be doped with boron as a typical impurity element; for example, an impurity gas such as $B_2H_6$ may be added to silicon hydride or silicon halide. The semiconductor film 55 can be formed using a microcrystalline semiconductor film or an amorphous semiconductor film.

Figure 6:
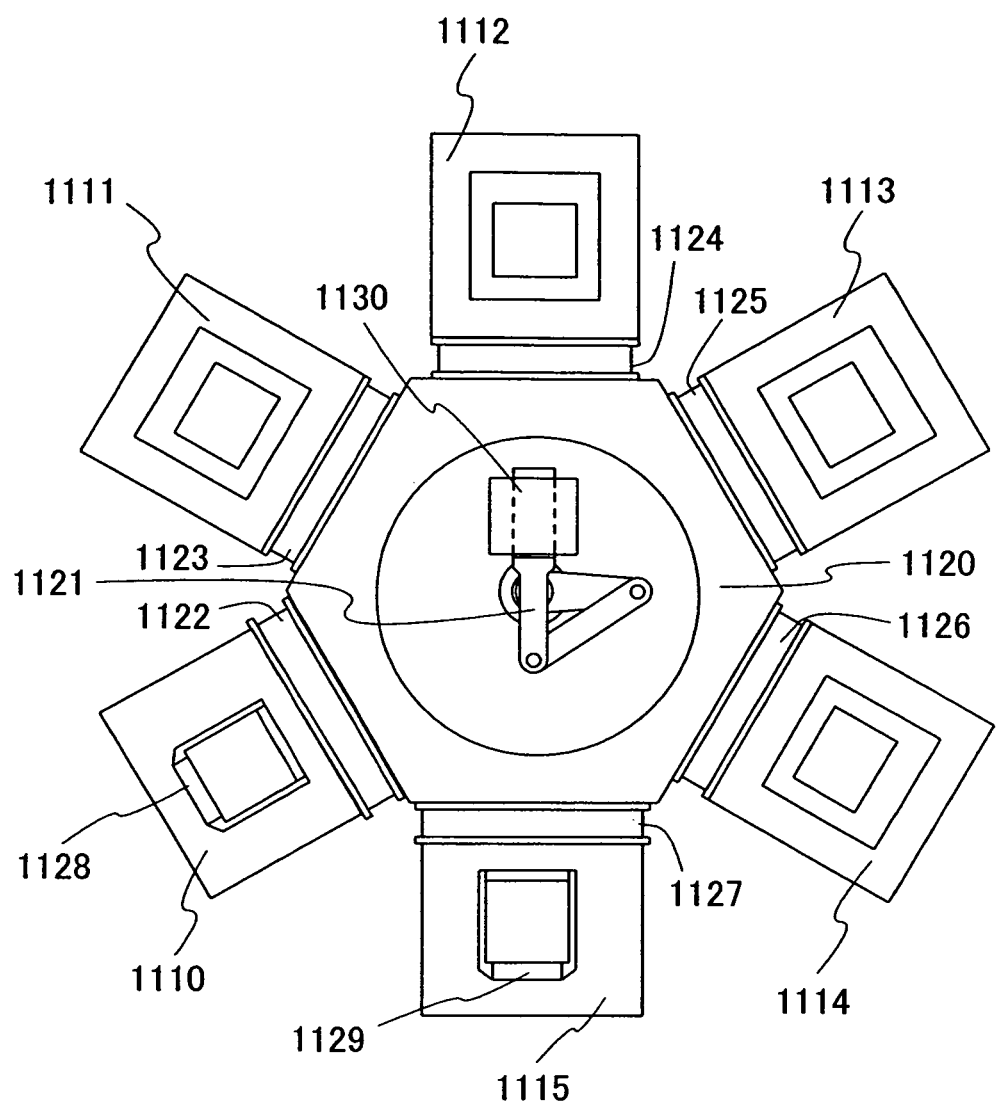
FIG. 6 is an explanatory top view of a microwave plasma CVD apparatus according to the present invention.

FIG. 6 illustrates a microwave plasma CVD apparatus by which the films from the insulating film 53 to the semiconductor film 55 can be formed successively. FIG. 6 schematically shows a top view of the microwave plasma CVD apparatus. A common chamber 1120 is connected to load/unload (L/UL) chambers 1110 and 1115, and reaction chambers (1) 1111 to (4) 1114 via gate valves 1122 to 1127. Substrates 1130 are set in cassettes 1128 and 1129 of the load/unload (L/UL) chambers 1110 and 1115 and transferred to the reaction chambers (1) to (4) by a transfer unit 1121 of the common chamber 1120.

In each of the reaction chambers (1) to (4), the insulating film 53, the microcrystalline semiconductor film 54, and the semiconductor film 55 are stacked successively. In this case, by changing source gases, different kinds of films can be stacked successively. Alternatively, the insulating film 53 and the microcrystalline semiconductor film 54 are stacked successively in each of the reaction chambers (1) and (3), and the semiconductor film 55 is formed in each of the reaction chambers (2) and (4). When only the semiconductor film 55 to which an impurity element imparting one conductivity type is added is formed separately from other films in this manner, impurity elements remaining in the chamber can be prevented from being mixed into other films.

In this manner, by use of the microwave plasma CVD apparatus in which the plurality of chambers are connected, the insulating film 53, the microcrystalline semiconductor film 54, and the semiconductor film 55 can be formed at the same time, so that the mass productivity can be enhanced. Further, also when a certain reaction chamber is subjected to maintenance or cleaning, the films can be formed in other reaction chambers, and the films can be formed efficiently. In addition, an interface between the films can be formed without being contaminated with atmospheric components or impurity elements contained in the atmosphere; thus, variations in characteristics of the thin film transistors can be reduced.

Further, when the insulating film 53 is formed with a two-layer structure including a silicon oxide film or a silicon oxynitride film, and a silicon nitride film or a silicon nitride oxide film, a silicon oxide film or a silicon oxynitride film in the insulating film 53 is formed in the reaction chamber (1); a silicon nitride film or a silicon nitride oxide film in the insulating film 53 is formed in the reaction chamber (2); the microcrystalline semiconductor film 54 is formed in the reaction chamber (3); and the semiconductor film 55 is formed in the reaction chamber (4). At this time, the inner wall of each reaction chamber is preferably coated with a film corresponding to the film to be formed. By use of the microwave plasma CVD apparatus having such a structure, one kind of film can be formed in each reaction chamber, and the films can be formed successively without being exposed to the atmosphere. Thus, an interface between the films can be formed without being contaminated with residues of another film which has been formed or impurity elements contained in the atmosphere.

In FIG. 6, the microwave plasma CVD apparatus is provided with a plurality of load/unload (L/UL) chambers but may also be provided with only one load/unload (L/UL) chamber. In addition, the microwave plasma CVD apparatus may be provided with a spare chamber. By pre-heating the substrate in the spare chamber, it is possible to shorten heating time before formation of the film in each reaction chamber, so that the throughput can be improved.

Figure 7:
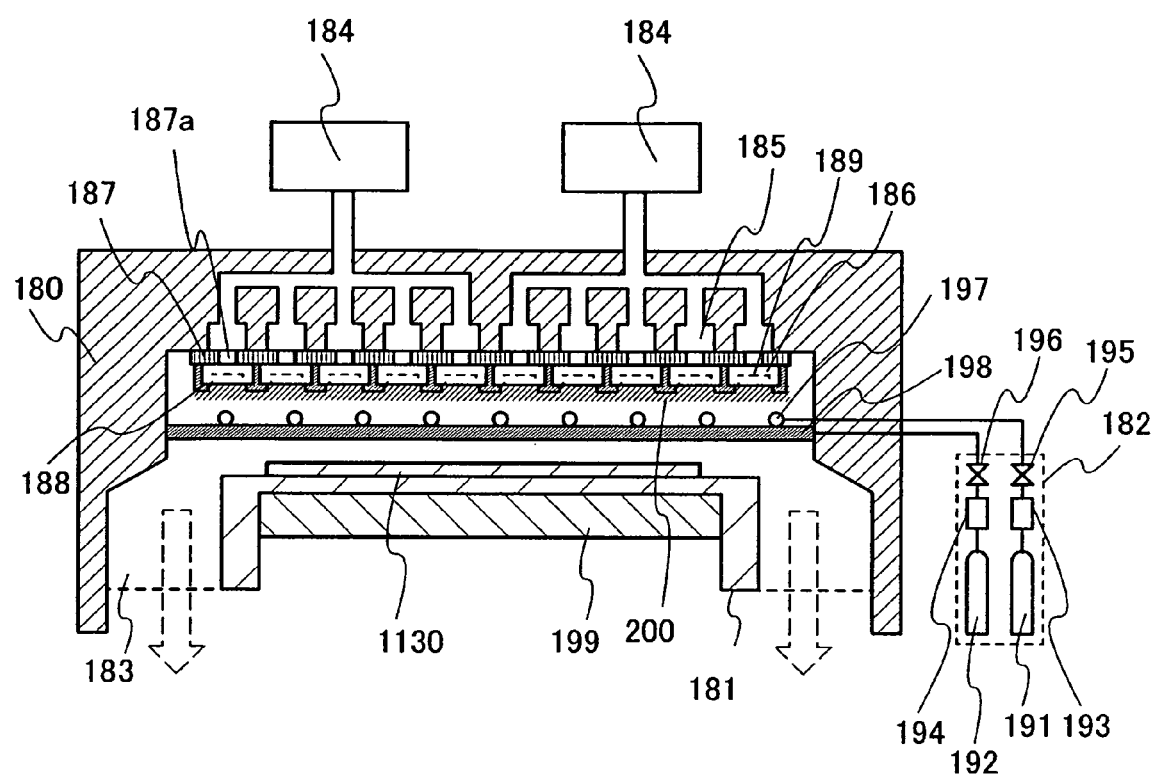
FIG. 7 is an explanatory cross-sectional view of a reaction chamber of a microwave plasma CVD apparatus according to the present invention.

FIG. 7 illustrates a detailed structure of one reaction chamber of the microwave plasma CVD apparatus. The reaction chamber of the microwave plasma CVD apparatus includes a treatment container 180, a support 181 which is provided in the treatment container 180 and on which the substrate 1130 is disposed, a gas supply unit 182 for introducing a gas to the treatment container 180, an exhaust port 183 connected to a vacuum pump for exhausting a gas in the treatment container 180, microwave generation units 184 for supplying microwaves for generating plasma, waveguides 185 for introducing the microwaves from the microwave supply units 184 to the treatment container 180, a top plate 187 which is in contact with the waveguides 185 and has openings 187a, and a plurality of dielectric plates 186 fixed to the top plate 187 with fixing members 188. In addition, a gas pipe 197 through which a non-source gas flows (hereinafter referred to as the gas pipe 197) and a gas pipe 198 through which a source gas flows (hereinafter referred to as the gas pipe 198) are provided between the substrate 1130 and the dielectric plates 186. The gas pipes 197 and 198 are connected to the gas supply unit 182. Specifically, the gas pipe 197 is connected to a non-source gas supply source 191 via a valve 195 and a mass flow controller 193. Further, the gas pipe 198 is connected to a source gas supply source 192 via a valve 196 and a mass flow controller 194. By provision of a temperature controller 199 for the support 181, the temperature of the substrate 1130 can be controlled. A high-frequency power source may be connected to the support 181, so that predetermined bias voltage may be applied to the support 181 by AC electric power output from the high-frequency power source. Note that the gas supply unit 182 and the microwave generation units 184 are provided outside the reaction container.

The microwave generation unit 184 supplies microwaves with a frequency of greater than or equal to 1 GHz, preferably greater than or equal to 2.45 GHz, and more preferably greater than or equal to 8.3 GHz. In the present invention, stable large-area plasma can be generated by provision of the plurality of microwave generation units 184. Therefore, a highly uniform film can be formed over a large-sized substrate with one side of over 600 mm, particularly over 1000 mm, and a film-formation rate can be increased.

The treatment container 180 and the top plate 187 are formed of a metal whose surface is covered with an insulating film, e.g., alumina, silicon oxide, or a fluorine resin, for example, an alloy containing aluminum. In addition, the fixing member 188 is formed of a metal such as an alloy containing aluminum.

The dielectric plates 186 are provided so as to be in close contact with the openings of the top plate 187. The microwaves generated in the microwave generation units 184 are propagated to the dielectric plates 186 by passing through the waveguides 185 and the openings 187a of the top plate 187 and transmitted through the dielectric plates 186 to be released into the treatment container. By field effect energy of the microwaves released into the treatment container, the non-source gas is made into a plasma state. This plasma 200 has higher density on the surface of the dielectric plates 186; thus, damage to the substrate 1130 can be reduced. By provision of the plurality of dielectric plates 186, uniform large-area plasma can be generated and kept. The dielectric plate 186 is formed of ceramics such as sapphire, quartz glass, alumina, silicon oxide, or silicon nitride. The dielectric plate 186 may have a recessed portion 189 on the side where the plasma 200 is generated. By the recessed portion 189, stable plasma can be generated. By provision of the plurality of dielectric plates 186, a highly uniform film can be formed over a large-sized substrate with one side of over 600 mm, particularly over 1000 mm, and a film-formation rate can be increased.

The gas pipe 197 and the gas pipe 198 are provided to intersect with each other. The outlet of the gas pipe 197 is provided on the dielectric plates 186 side, and the outlet of the gas pipe 198 is provided on the substrate 1130 side. By release of the non-source gas to the dielectric plates 186 side, the plasma 200 can be generated while formation of the film on the surface of the dielectric plates 186 is prevented. Further, since the outlet of the gas pipe 198 is provided on the substrate 1130 side, the source gas can be released to a position which is closer to the substrate 1130, and a film-formation rate can be increased. The gas pipes 197 and 198 are formed of ceramics such as alumina or aluminum nitride. Transmissivity of the microwaves is high in the ceramics; therefore, when the gas pipes 197 and 198 are formed of ceramics, distribution of the plasma can be uniform without an electric field being disturbed, even when the gas pipe is provided right under the dielectric plates 186.

The following will describe a process for forming a film. For this process, a gas supplied from the gas supply unit 182 may be selected for forming a desired film.

First, a process for forming a silicon oxynitride film is described with reference to FIGS. 7 and 8. The process starts at a step S170 in FIG. 8. The temperature of the substrate 1130 is controlled at a step S171. The substrate 1130 is at room temperature or heated by the temperature controller 199 to 100° C. to 550° C. At a step S172, the inside of the treatment container 180 is made into a vacuum state, and one or more rare gases such as helium, argon, xenon, and krypton, and oxygen are introduced into the treatment container 180 in order to generate plasma. When oxygen as well as the rare gas is introduced into the treatment container 180, plasma can be easily generated. The distance between the substrate 1130 and the dielectric plates 186 is approximately 10 mm to 200 mm (preferably 110 mm to 160 mm). Next, at a step S173, the pressure in the treatment container 180 is set at predetermined pressure, 1 Pa to 200 Pa, preferably 1 Pa to 100 Pa, more preferably 1 Pa to 40 Pa. Then, at a step S174, the microwave generation units 184 are turned on, and the microwaves are supplied from the microwave generation units 184 to the waveguides 185, so that the plasma is generated in the treatment container 180. The output power of the microwave generation unit is set at 500 W to 6000 W, preferably 4000 W to 6000 W. By excitation of plasma by introducing the microwaves, plasma with low electron temperature (0.7 eV to 3 eV, inclusive, preferably 0.7 eV to 1.5 eV, inclusive) and high electron density ($1\times10^{11}$ atoms/cm$^3$ to $1\times10^{13}$ atoms/cm$^3$) can be generated. Next, at a step S175, a source gas is introduced from the gas pipe 198 into the treatment container 180. Specifically, supply of oxygen is halted, and dinitrogen monoxide, a rare gas, and silicon hydride or silicon halide are introduced as a source gas, whereby the silicon oxynitride film can be formed over the substrate 1130. Then, at a step S176, supply of the source gas is halted, the pressure in the treatment container is lowered, and the microwave generation units are turned off, so that the process finishes at a step S177.

In the process for forming the silicon oxynitride film, the temperature of the substrate is set at 300° C. to 350° C.; the flow of dinitrogen monoxide is set at 10 to 300 times the flow of silane, preferably 50 to 200 times; two to six microwave generation units with a power of 5 kW are used; the pressure in the treatment container is set at 10 Pa to 100 Pa, preferably 10 Pa to 50 Pa; and the distance between the substrate 1130 and the dielectric plates 186 is set at 110 mm to 160 mm, inclusive, whereby a silicon oxynitride film with high resistance to voltage can be formed.

Next, a process for forming the microcrystalline semiconductor film 54 is described. The process starts at the step S170 in FIG. 8. The temperature of the substrate 1130 is controlled at the step S171. The substrate 1130 is at room temperature or heated by the temperature controller 199 to 100° C. to 550° C. At the step S172, the inside of the treatment container 180 is made into a vacuum state, and a rare gas such as helium, argon, xenon, or krypton is introduced into the treatment container 180 in order to generate plasma. The distance between the substrate 1130 and the dielectric plates 186 is approximately 10 mm to 200 mm (preferably 110 mm to 160 mm). Next, at the step S173, the pressure in the treatment container 180 is set at predetermined pressure, 1 Pa to 200 Pa, preferably 1 Pa to 100 Pa. Then, at the step S174, the microwave generation units 184 are turned on, and the microwaves are supplied from the microwave generation units 184 to the waveguides 185, so that the plasma is generated in the treatment container 180. The output power of the microwave generation unit is set at 500 W to 6000 W, preferably 4000 W to 6000 W. By excitation of plasma by introducing the microwaves, plasma with low electron temperature (0.7 eV to 3 eV, inclusive, preferably 0.7 eV to 1.5 eV, inclusive) and high electron density ($1\times10^{11}$ atoms/cm$^3$ to $1\times10^{13}$ atoms/cm$^3$) can be generated. Next, at the step S175, a source gas is introduced from the gas pipe 198 into the treatment container 180. Specifically, silicon hydride such as SiH$_4$ or Si$_2$H$_6$, or silicon halide such as SiH$_2$Cl$_2$ or SiHCl$_3$ is introduced, so that the microcrystalline semiconductor film can be formed. Alternatively, silicon hydride such as SiH$_4$ or Si$_2$H$_6$, or silicon halide such as SiH$_2$Cl$_2$ or SiHCl$_3$, and hydrogen are introduced, so that the microcrystalline semiconductor film can be formed. Then, at the step S176, supply of the source gas is halted, the pressure in the treatment container is reduced, and the microwave generation units are turned off, so that the process finishes at the step S177.

When a rare gas such as argon is also used for generating or keeping plasma, separation of the source gas and formation of radicals can be conducted efficiently by excited species of the rare gas.

Plasma which is generated by the microwave plasma CVD apparatus with a frequency of greater than or equal to 1 GHz, preferably greater than or equal to 2.45 GHz, more preferably greater than or equal to 8.3 GHz has high electron density and forms a lot of radicals from the source gas which are supplied to the substrate 1130. Thus, surface reaction of radicals on the substrate is promoted and a film-formation rate of the microcrystalline semiconductor film can be increased. Further, by use of the microwave plasma CVD apparatus provided with a plurality of microwave generation units and dielectric plates, stable large-area plasma can be generated. Therefore, a film whose quality is highly uniform can be formed over a large-sized substrate, and mass productivity can be increased.

When the n-channel thin film transistor is formed, the semiconductor film 55 may be doped with phosphorus as a typical impurity element and may be formed by a plasma CVD method using silicon hydride or silicon halide and an impurity gas such as PH$_3$. Further, when the p-channel thin film transistor is formed, the semiconductor film 55 may be doped with boron as a typical impurity element and may be formed by a plasma CVD method using silicon hydride or silicon halide and an impurity gas such as B$_2$H$_6$. By setting the concentration of phosphorus or boron at $1\times10^{19}$ atoms/cm$^3$ to $1\times10^{21}$ atoms/cm$^3$, ohmic contact between the semiconductor film 55 and source and drain electrodes which are formed later can be obtained. The semiconductor film 55 can be formed of a microcrystalline semiconductor or an amorphous semiconductor with a thickness of 2 nm to 50 nm, inclusive. If the semiconductor film 55 is thinned, the throughput can be improved.

Figure 8:
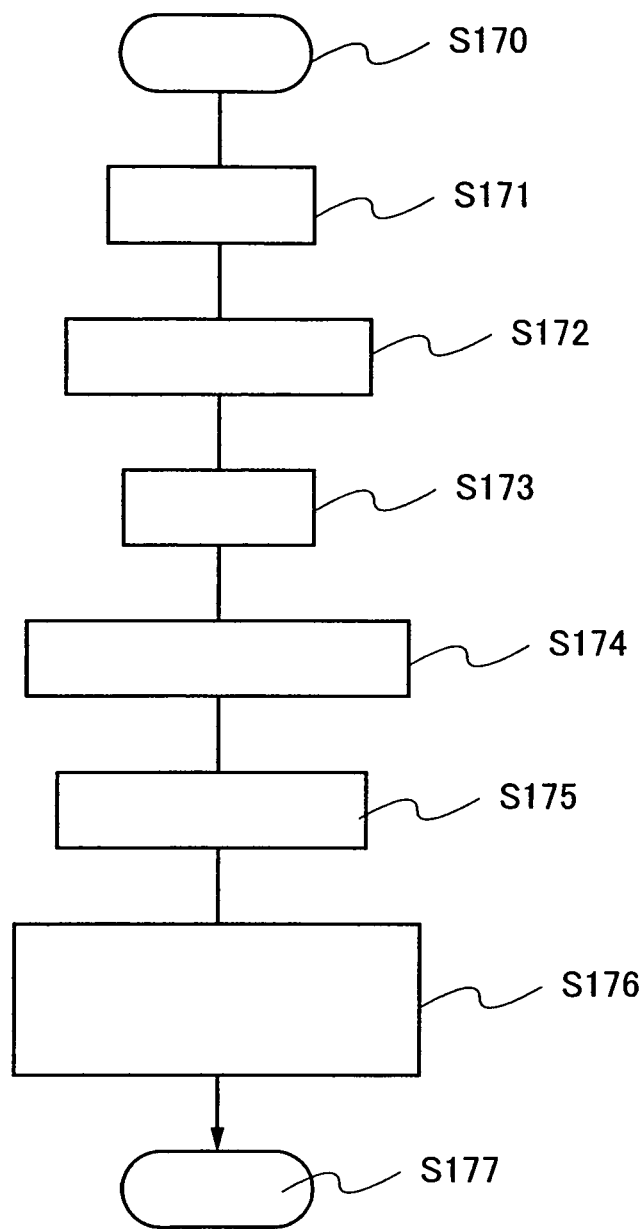
FIG. 8 is a flow chart showing a process for forming a film according to the present invention.

In addition, the semiconductor film 55 may be formed in a similar manner to the microcrystalline semiconductor film 54 by use of the microwave plasma CVD apparatus with a frequency of greater than or equal to 1 GHz as illustrated in FIG. 7 and manufacturing steps in FIG. 8. In this case, at the step S175, silicon hydride or silicon halide, PH$_3$ or B$_2$H$_6$, and hydrogen are introduced as a source gas, whereby a microcrystalline semiconductor film to which an impurity element imparting one conductivity type is added can be formed.

Figure 1C:
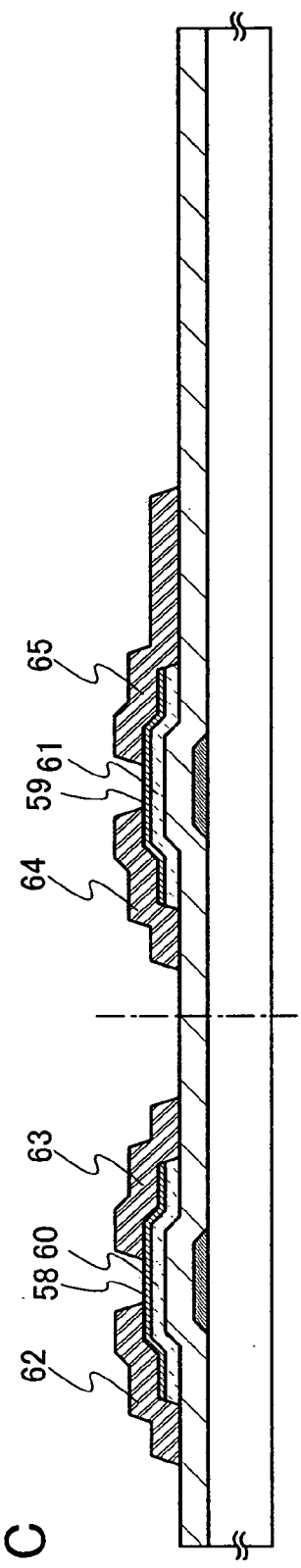

Next, masks 56 and 57 are formed over the semiconductor film 55. The microcrystalline semiconductor film 54 and the semiconductor film 55 are etched to be separated into island shapes. Consequently, microcrystalline semiconductor films 60 and 61 and semiconductor films 58 and 59 to which an impurity element imparting one conductivity type is added (hereinafter referred to as the semiconductor films 58 and 59) are formed as illustrated in FIG. 1C.

After that, source and drain electrodes 62 to 65 are formed over the semiconductor films 58 and 59 and the insulating film 53. The source and drain electrodes 62 to 65 are preferably formed using aluminum, copper or an aluminum alloy to which an element to improve resistance to heat or an element which prevents hillocks such as silicon, titanium, neodymium, scandium, or molybdenum is added. Alternatively, a layer in contact with the semiconductor film to which an impurity element imparting one conductivity type is added may be formed of titanium, tantalum, molybdenum, or tungsten, or nitride of such an element, and aluminum or an aluminum alloy may be formed thereover to form a stacked-layer structure. Further alternatively, top and bottom surfaces of aluminum or an aluminum alloy may be each covered with titanium, tantalum, molybdenum, tungsten, or nitride thereof to form a stacked-layer structure.

The source and drain electrodes 62 to 65 can be formed as follows: a conductive film is formed over the semiconductor films 58 and 59 and the insulating film 53 by a sputtering method or a vacuum evaporation method, a mask is formed over the conductive film by a photolithography technique or a coating method, and the conductive film is etched using the mask. The source and drain electrodes 62 to 65 may also be formed by discharging a conductive nanopaste of silver, gold, copper, or the like by a screen printing method, an ink-jet method, or the like and baking it.

Figure 2A:
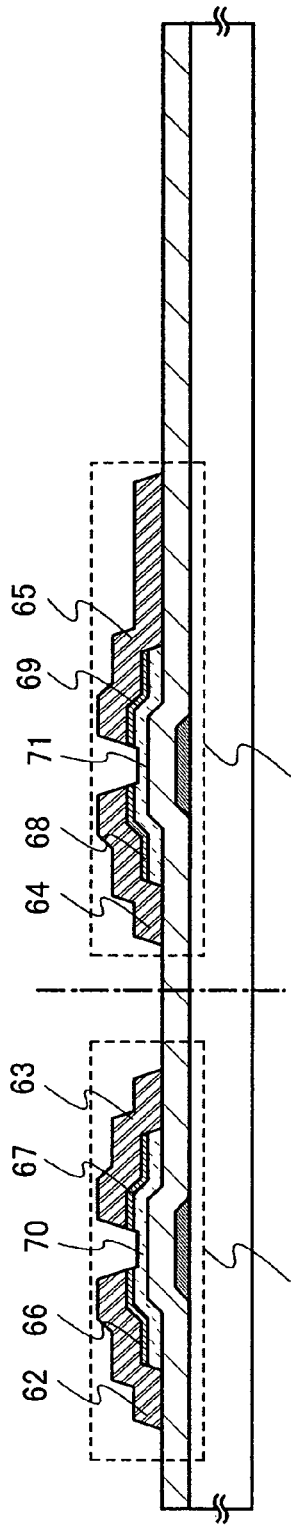
FIGS. 2A to 2C are explanatory cross-sectional views of a method for manufacturing a display device according to the present invention.

Next, as illustrated in FIG. 2A, the semiconductor films 58 and 59 are etched using the source and drain electrodes 62 to 65 as masks or using a mask for forming the source and drain electrodes 62 to 65, which is not illustrated, so that source and drain regions 66 to 69 are formed. In this step, since etching selectivity with respect to the microcrystalline semiconductor films 60 and 61 which functions as a base is not high, the microcrystalline semiconductor films 60 and 61 are also slightly etched, whereby microcrystalline semiconductor films 70 and 71 which function as channel formation regions are formed.

In this embodiment mode, the source and drain electrodes 62 to 65 and the source and drain regions 66 to 69 are formed by etching the conductive film and the semiconductor film to which an impurity element imparting one conductivity type is added by a dry etching method using the same resist masks.

Through the above process, channel etched thin film transistors 72 and 73 can be formed. With the channel etched thin film transistor, the number of manufacturing steps can be reduced and the cost can be reduced. In addition, by formation of the channel formation region using a microcrystalline semiconductor film, a field effect mobility of 2 $cm^2/V \cdot sec$ to 10 $cm^2/V \cdot sec$ can be obtained. Therefore, these thin film transistors can be used as a switching element of a pixel in a pixel portion 89 and an element included in a driver circuit 88 on a scanning line (gate line) side.

Figure 2B:
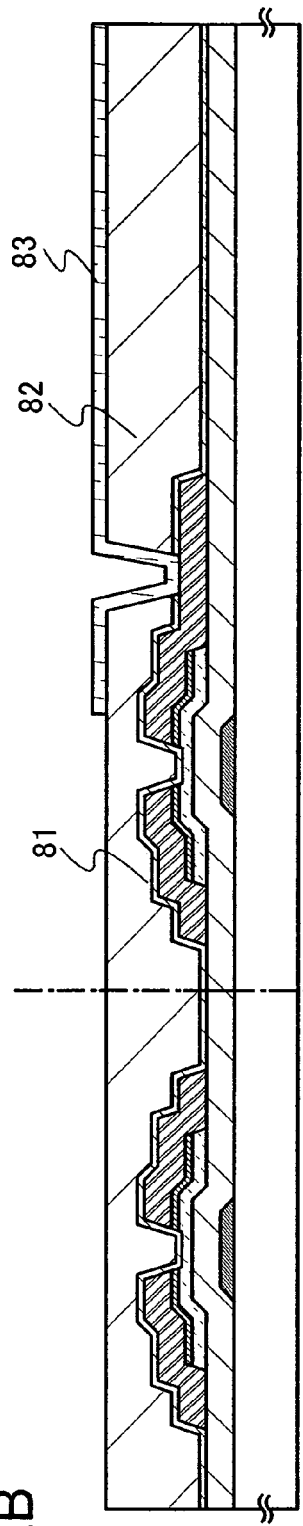

Next, as illustrated in FIG. 2B, an insulating film 81 is formed over the thin film transistors 72 and 73 in order to protect the channel formation regions; a planarizing film 82 having a contact hole is preferably formed over the insulating film 81; and a pixel electrode 83 in contact with the source or drain electrode through the contact hole is formed over the planarizing film 82.

The insulating film 81 can be formed in a similar manner to the insulating film 53. The insulating film 81 is provided to prevent a contamination impurity such as an organic substance or a metal contained in the atmosphere, or moisture from entering and is preferably a dense film. By formation of the insulating film 81 using a silicon nitride film, the oxygen concentration in the microcrystalline semiconductor films 70 and 71 functioning as channel formation regions can be set at less than or equal to $5 \times 10^{19}$ atoms/$cm^3$, preferably less than or equal to $1 \times 10^{19}$ atoms/$cm^3$.

The planarizing film 82 is preferably an insulating film formed of an organic resin such as acrylic, polyimide, or polyamide, or a siloxane polymer.

In FIG. 2B, a cathode material is preferably used for the pixel electrode 83 since the thin film transistor in the pixel is n-type. In the case where the thin film transistor in the pixel is p-type, an anode material is preferably used. Specifically, a known material having a low work function such as Ca, Al, CaF, MgAg, or AlLi can be used as a cathode material.

Next, as illustrated in 2C, a partition wall 84 is formed over the planarizing film 82 and an end portion of the pixel electrode 83. The partition wall 84 has an opening and the pixel electrode 83 is exposed in the opening. The partition wall 84 is formed using an organic resin film or an inorganic insulating film. If the partition wall 84 is formed of a photosensitive material, and the opening is formed over the pixel electrode and a side wall of the opening forms an inclined surface with a continuous curvature, disconnection of a light-emitting layer 85 which is formed later can be reduced, which is preferable.

Then, the light-emitting layer 85 is formed to be in contact with the pixel electrode 83 in the opening of the partition wall 84. The light-emitting layer 85 may be formed using a single layer or by stacking a plurality of layers.

Figure 2C:
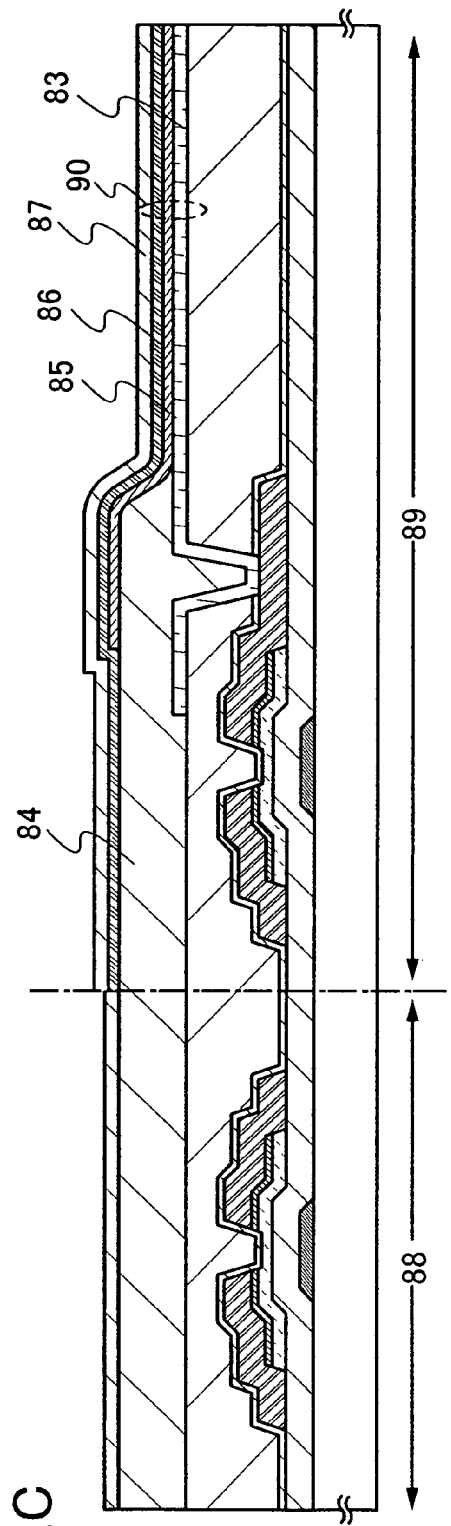

Then, a common electrode 86 is formed of an anode material so as to cover the light-emitting layer 85. The common electrode 86 can be formed of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added. The common electrode 86 can be formed using a titanium nitride film or a titanium film as well as the above transparent conductive films. In FIG. 2C, the common electrode 86 is formed of ITO. In the opening of the partition wall 84, the pixel electrode 83, the light-emitting layer 85, and the common electrode 86 overlap with one another, so that a light-emitting element 90 is formed. After that, a protective film 87 is preferably formed over the common electrode 86 and the partition wall 84 so that oxygen, hydrogen, moisture, carbon dioxide, or the like does not enter the light-emitting element 90. As the protective film 87, a silicon nitride film, a silicon nitride oxide film, a DLC (diamond like carbon) film, or the like can be formed.

Further, in a practical case, it is preferable that a display device completed to the state illustrated in FIG. 2C be packaged (sealed) with a protective film (such as a laminated film or an ultraviolet curable resin film) or a cover material having high air-tightness and less degasification so that the display device is not exposed to the outside air.

Although FIGS. 1A to 2C illustrate the method for manufacturing a light-emitting device having channel etched thin film transistors, the light-emitting device can also be formed using channel protective thin film transistors. A manufacturing method thereof will be described with reference to FIGS. 3A to 3C.

As illustrated in FIG. 3A, gate electrodes 51 and 52 are formed over a substrate 50. Next, an insulating film 53 functioning as a gate insulating film (hereinafter referred to as the insulating film 53) and a microcrystalline semiconductor film 54 are formed over the gate electrodes 51 and 52. The microcrystalline semiconductor film 54 can be easily formed by use of a microwave plasma CVD apparatus with a frequency of greater than or equal to 1 GHz.

Next, channel protective films 94 and 95 are formed over the microcrystalline semiconductor film 54 so as to overlap with the gate electrodes 51 and 52, respectively. The channel protective films 94 and 95 can be formed as follows: an insulating film is formed over the microcrystalline semiconductor film 54 using silicon nitride, silicon nitride oxide, silicon oxide, or silicon oxynitride by a sputtering method, a CVD method, or the like; a mask is formed over the insulating film; and the insulating film is etched using the mask. Further, the channel protective films 94 and 95 can also be formed by discharging a composition containing polyimide, acrylic, or siloxane and baking it.

Then, a semiconductor film 96 to which an impurity element imparting one conductivity type is added (hereinafter referred to as the semiconductor film 96) is formed over the channel protective films 94 and 95, and masks 97 and 98 are formed over the semiconductor film 96. The semiconductor film 96 can be formed in a similar manner to the semiconductor film 55 illustrated in FIG. 1B. The masks 97 and 98 can be formed in a similar manner to the masks 56 and 57 illustrated in FIG. 1B.

The semiconductor film 96 and the microcrystalline semiconductor film 54 are etched to be separated using the masks 97 and 98, so that microcrystalline semiconductor films 60 and 61 functioning as channel formation regions and semiconductor films 58 and 59 to which an impurity element imparting one conductivity type is added (hereinafter referred to as the semiconductor films 58 and 59) are formed as illustrated in FIG. 3B.

Next, source and drain electrodes 62 to 65 are formed over the semiconductor films 58 and 59 and the insulating film 53.

Then, the semiconductor films 58 and 59 are etched using the source and drain electrodes 62 to 65 as masks, so that source and drain regions 101 to 104 are formed as illustrated in FIG. 3C. At this time, the channel protective films 94 and 95 are partially etched. These partially etched channel protective films are referred to as channel protective films 105 and 106.

Through the above process, a channel protective thin film transistor including the gate electrode 51 and the channel protective film 105 which overlaps with the microcrystalline semiconductor film 60, and a channel protective thin film transistor including the gate electrode 52 and the channel protective film 106 which overlaps with the microcrystalline semiconductor film 61 can be manufactured. By formation of the channel protective thin film transistors over an element substrate, variations in element characteristics of the thin film transistors can be reduced and off current can be reduced. Further, by formation of the channel formation region using the microcrystalline semiconductor film, a field effect mobility of 2 cm$^2$/V·sec to 10 cm$^2$/V·sec can be obtained. Therefore, these thin film transistors can be used for a switching element of a pixel in a pixel portion 89 and an element included in a driver circuit 88 on a scanning line (gate line) side.

Next, a structure of a light-emitting element will be described with reference to FIGS. 4A to 4C. A cross-sectional structure of a pixel will be described by taking an n-channel driving TFT as an example.

In order to extract light emission of a light-emitting element, at least one of an anode and a cathode may be transparent. A thin film transistor and a light-emitting element are formed over a substrate. There are light-emitting elements having a top emission structure in which light emission is extracted through the surface opposite to the substrate, having a bottom emission structure in which light emission is extracted through the surface on the substrate side, and having a dual emission structure in which light emission is extracted through the surface opposite to the substrate and the surface on the substrate side. The pixel structure of the present invention can be applied to a light-emitting element having any of these emission structures.

A light-emitting element having the top emission structure is described with reference to FIG. 4A.

Figure 4A:
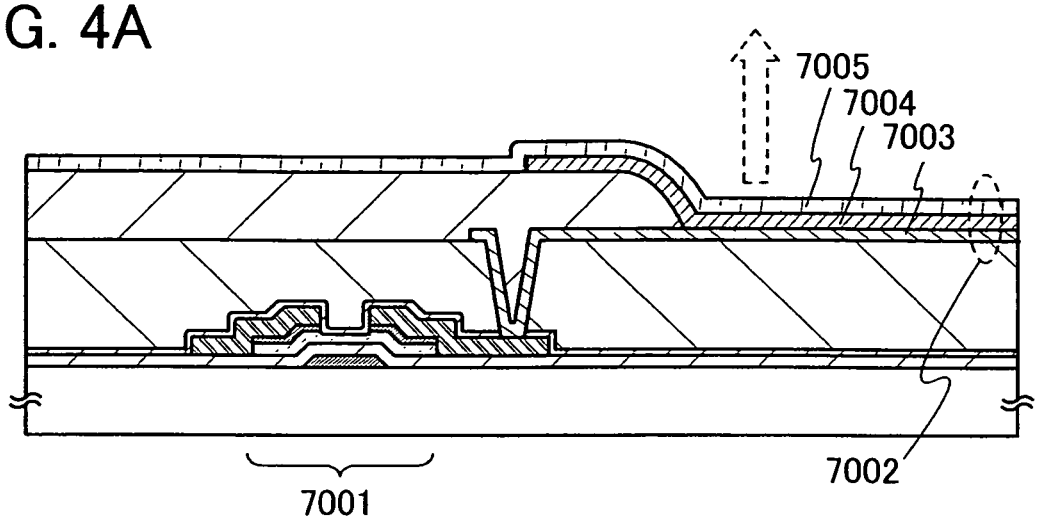
FIGS. 4A to 4C are cross-sectional views each showing a pixel in a light-emitting device which can be applied to the present invention.

FIG. 4A is a cross-sectional view of a pixel in the case where a driving TFT 7001 is n-type, and light generated in a light-emitting element 7002 is emitted to pass through an anode 7005. In FIG. 4A, a cathode 7003 of the light-emitting element 7002 and the driving TFT 7001 are electrically connected to each other. A light-emitting layer 7004 and the anode 7005 are stacked in order over the cathode 7003. As the cathode 7003, a known conductive film can be used as long as it has a low work function and reflects light. For example, Ca, Al, CaF, MgAg, AlLi, or the like is preferably used. The light-emitting layer 7004 may be formed using a single layer or by stacking a plurality of layers. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in order over the cathode 7003. It is not necessary to form all of these layers. The anode 7005 may be formed using a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the cathode 7003 and the anode 7005 sandwich the light-emitting layer 7004. In the pixel illustrated in FIG. 4A, light generated in the light-emitting element 7002 is emitted to pass through the anode 7005 as denoted by an outline arrow.

Then, a light-emitting element having the bottom emission structure is described with reference to FIG. 4B. FIG. 4B is a cross-sectional view of a pixel in the case where a driving TFT 7011 is n-type, and light generated in a light-emitting element 7012 is emitted to pass through a cathode 7013. In FIG. 4B, the cathode 7013 of the light-emitting element 7012 is formed over a transparent conductive film 7017 electrically connected to the driving TFT 7011, and a light-emitting layer 7014 and an anode 7015 are stacked in order over the cathode 7013. A light-blocking film 7016 for reflecting or blocking light may be formed so as to cover the anode 7015 when the anode 7015 has a light-transmitting property. As the cathode 7013, a known conductive film can be used as in the case of FIG. 4A as long as it has a low work function. The cathode 7013 is formed to have a thickness that can transmit light (preferably, approximately from 5 nm to 30 nm). For example, Al having a thickness of 20 nm can be used as the cathode 7013. The light-emitting layer 7014 may be formed of a single layer or by stacking a plurality of layers as in the case of FIG. 4A. The anode 7015 is not required to transmit light therethrough, but can be formed using a transparent conductive film as in the case of FIG. 4A. As the light-blocking film 7016, a metal or the like that reflects light can be used; however, it is not limited to a metal film. For example, a resin or the like to which black pigments are added can be used.

The light-emitting element 7012 corresponds to a region where the cathode 7013 and the anode 7015 sandwich the light-emitting layer 7014. In the pixel illustrated in FIG. 4B, light generated in the light-emitting element 7012 is emitted to pass through the cathode 7013 as denoted by an outline arrow.

Then, a light-emitting element having the dual emission structure is described with reference to FIG. 4C. In FIG. 4C, a cathode 7023 of a light-emitting element 7022 is formed over a transparent conductive film 7027 which is electrically connected to a driving TFT 7021, and a light-emitting layer 7024 and an anode 7025 are stacked in order over the cathode 7023. As the cathode 7023, a known conductive film can be used as long as it has a low work function as in the case of FIG. 4A. The cathode 7023 is formed to have a thickness that can transmit light. For example, Al having a thickness of 20 nm can be used as the cathode 7023. The light-emitting layer 7024 may be formed using a single layer or by stacking a plurality of layers as in the case of FIG. 4A. The anode 7025 can be formed using a transparent conductive film that can transmit light as in the case of FIG. 4A.

The light-emitting element 7022 corresponds to a region where the cathode 7023 and the anode 7025 sandwich the light-emitting layer 7024. In the pixel illustrated in FIG. 4C, light generated in the light-emitting element 7022 is emitted to pass through both the anode 7025 and the cathode 7023 as denoted by outline arrows.

The structure in which the driving TFT is electrically connected to the light-emitting element is described in this embodiment mode. However, a current control TFT which controls current flowing through the light-emitting element may also be formed between the driving TFT and the light-emitting element to be connected to them.

Figure 4B:
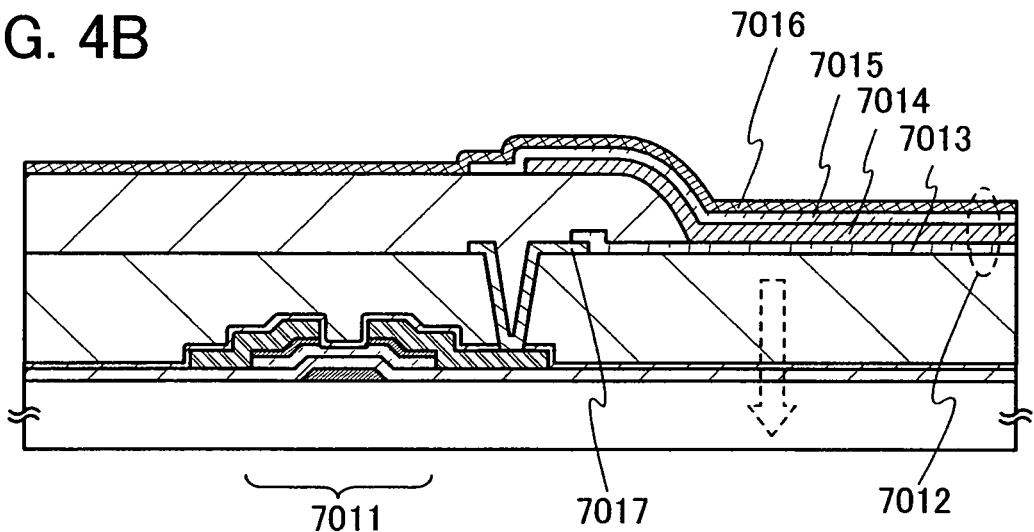
Figure 4C:
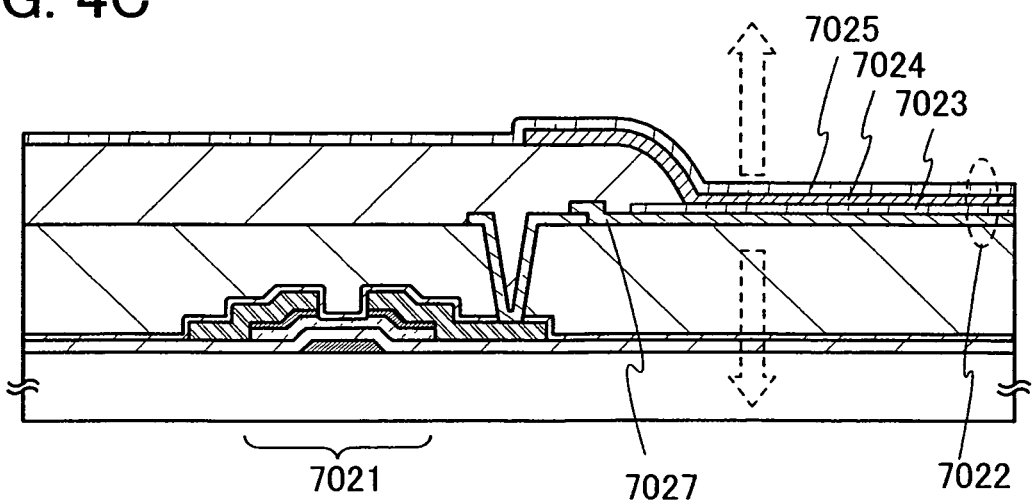

A light-emitting device described in this embodiment mode is not limited to the structures illustrated in FIGS. 4A to 4C, and can be modified in various ways based on the spirit of techniques according to the present invention.

The following will describe a manufacturing process of a liquid crystal display device as a display device with reference to FIGS. 1A to 1C, 2A to 2C, and 5.

Figure 5:
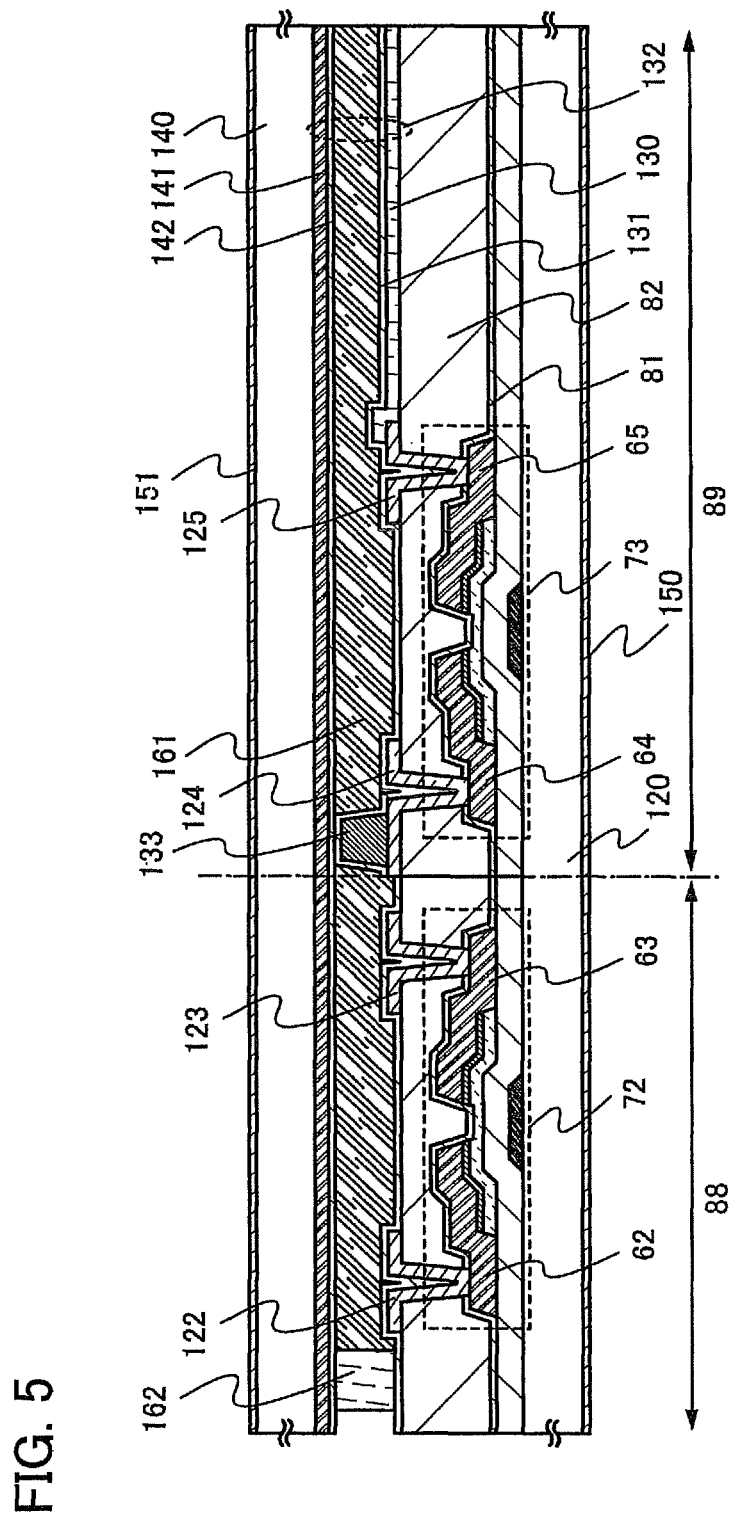
FIG. 5 is an explanatory cross-sectional view of a method for manufacturing a display device according to the present invention.

Through the manufacturing steps illustrated in FIGS. 1A to 2A, thin film transistors 72 and 73 are formed over a substrate 120 as illustrated in FIG. 5. Then, over the thin film transistors 72 and 73, an insulating film 81 functioning as a protective film, a planarizing film 82, and wirings 122 to 125 which are in contact with source and drain electrodes 62 to 65 of the thin film transistors 72 and 73, respectively, are formed. Next, a pixel electrode 130 connected to the wiring 125 is formed over the planarizing film 82.

In this embodiment mode, an example in which a transmissive liquid crystal display device is manufactured by forming the pixel electrode 130 using a transparent conductive film is shown; however, the liquid crystal display device of the present invention is not limited to this structure. By formation of the pixel electrode using a conductive film which can easily reflect light, a reflective liquid crystal display device can be formed. In that case, part of the wiring 125 can be used as the pixel electrode.

Next, a spacer 133 is formed over the wiring 124 or 125 using an insulating film. FIG. 5 illustrates an example in which the spacer 133 is formed over the wiring 124 using silicon oxide. There is no particular limitation on the order of forming the pixel electrode 130 and the spacer 133. Although a columnar spacer is formed as the spacer 133 in this embodiment mode, bead spacers may also be dispersed.

Then, an alignment film 131 is formed so as to cover the wirings 122 to 125, the spacer 133, and the pixel electrode 130, and rubbing treatment is performed to the alignment film 131.

Next, a sealant 162 for sealing liquid crystal is formed. Meanwhile, a second substrate 140 provided with a counter electrode 141 formed using a transparent conductive film and an alignment film 142 to which rubbing treatment is performed is prepared. Then, liquid crystal 161 is dripped to a region surrounded by the sealant 162, and the separately prepared second substrate 140 is attached to the first substrate 120 using the sealant 162 such that the counter electrode 141 and the pixel electrode 130 face each other. Note that a filler may be mixed in the sealant 162.

Alternatively, the sealant 162 may be provided for the second substrate 140, the liquid crystal 161 may be dripped to a region surrounded by the sealant 162, and then, the first substrate 120 and the second substrate 140 are attached to each other using the sealant 162.

A dispenser method (a dripping method) is used for injecting the liquid crystal; however, the present invention is not limited thereto. A dipping method (pumping method) in which the liquid crystal is injected using a capillary phenomenon after attaching the first substrate 120 and the second substrate 140 to each other using the sealant 162 may also be used.

Note that a color filter, a light-blocking film for preventing disclination (a black matrix), or the like may also be provided for the first substrate 120 or the second substrate 140. Further, a polarizing plate 150 is attached to a surface of the first substrate 120 which is opposite to the surface provided with the thin film transistor, and a polarizing plate 151 is attached to a surface of the second substrate 140 which is opposite to the surface provided with the counter electrode 141.

As a transparent conductive film for the pixel electrode 130 or the counter electrode 141, a material similar to that for the pixel electrode illustrated in FIG. 2B can be used as appropriate. A liquid crystal element 132 corresponds to a region where the pixel electrode 130 and the counter electrode 141 sandwich the liquid crystal 161.

Through the above process, a display device can be manufactured. Since plasma generated in the microwave plasma CVD apparatus with a frequency of greater than or equal to 1 GHz has high electron density, a film-formation rate of the microcrystalline semiconductor film can be increased by use of this apparatus. Therefore, mass productivity of display devices having thin film transistors using microcrystalline semiconductor films can be improved. In addition, a microwave plasma CVD apparatus including a plurality of microwave generation units and a plurality of dielectric plates can generate stable large-area plasma. Hence, a display device can be manufactured using a large-sized substrate, and mass productivity can be improved.

Embodiment Mode 2

Figure 12:
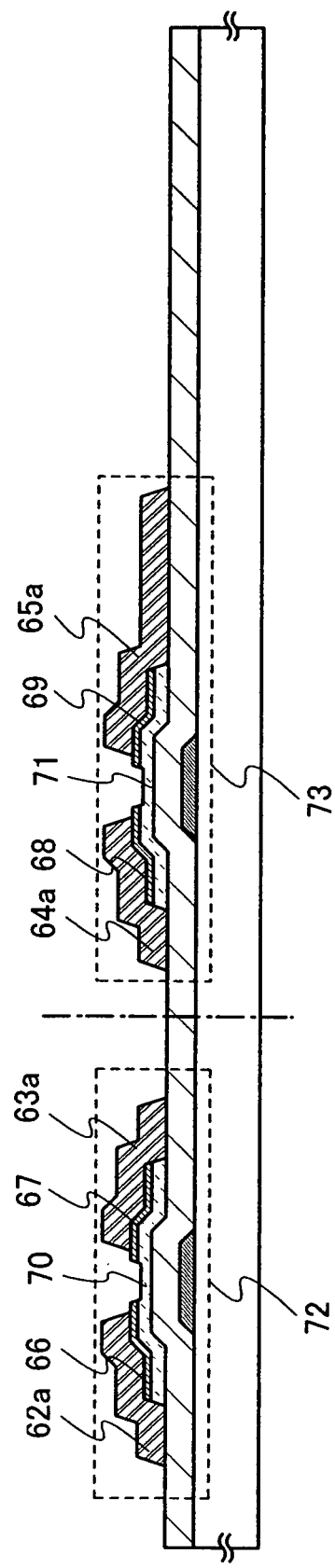
FIG. 12 is an explanatory cross-sectional view of a display device according to the present invention.

This embodiment mode will describe another structure of the thin film transistor shown in Embodiment Mode 1 with reference to FIG. 12.

Thin film transistors 72 and 73 described in this embodiment mode has a feature that, as illustrated in FIG. 12, end portions of source electrodes 62a and 64a and end portions of source regions 66 and 68 are not in alignment, and end portions of drain electrodes 63a and 65a and end portions of drain regions 67 and 69 are not in alignment.

In this embodiment mode, using the same resist mask, a conductive film is etched by wet etching to form the source and drain electrodes 62a to 65a, and a semiconductor film to which an impurity element imparting one conductivity type is added is etched by dry etching to form the source and drain regions 66 to 69. With the structure of the source and drain electrodes 62a to 65a in this embodiment mode, the distance between the facing electrodes is widened; therefore, short-circuit between the source and drain electrodes can be reduced, and the yield can be improved.

Embodiment Mode 3

This embodiment mode will describe a structure of a display panel which is one mode of the display device of the present invention.

Figure 9:
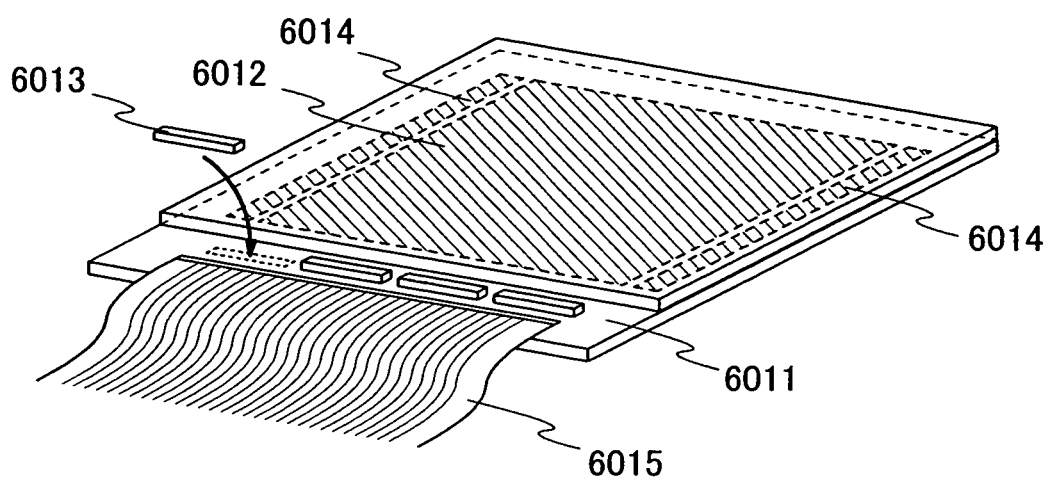
FIG. 9 is an explanatory perspective view of a display panel according to the present invention.

FIG. 9 illustrates a mode of a display panel in which a pixel portion 6012 formed over a substrate 6011 is connected to a signal line driver circuit 6013 which is separately formed. The pixel portion 6012 and a scanning line driver circuit 6014 are each formed using a thin film transistor which uses a microcrystalline semiconductor film. By forming the signal line driver circuit with a thin film transistor by which higher mobility can be obtained compared to a thin film transistor using the microcrystalline semiconductor film, operation of the signal line driver circuit which demands a higher driving frequency than that of the scanning line driver circuit can be stabilized. Note that the signal line driver circuit 6013 may be formed using a thin film transistor using a single-crystalline semiconductor, a thin film transistor using a polycrystalline semiconductor, or a thin film transistor using SOI. The pixel portion 6012, the signal line driver circuit 6013, and the scanning line driver circuit 6014 are each supplied with potential of a power source, a variety of signals, and the like via an FPC 6015.

Note that the signal driver circuit and the scanning line driver circuit may both be formed over the same substrate as that of the pixel portion.

Figure 10A:
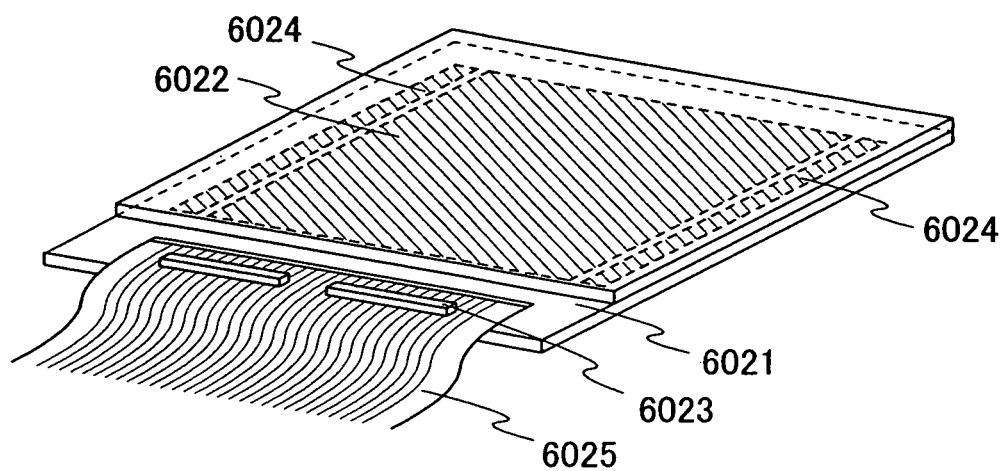
FIGS. 10A and 10B are explanatory perspective views of a display panel according to the present invention.

Also, when the driver circuit is separately formed, a substrate provided with the driver circuit is not always required to be attached to a substrate provided with the pixel portion, and may be attached to, for example, the FPC. FIG. 10A illustrates a mode of a display panel in which a signal line driver circuit 6023 is separately formed and a pixel portion 6022 and a scanning line driver circuit 6024 are formed over a substrate 6021. The pixel portion 6022 and the scanning line driver circuit 6024 are each formed with a thin film transistor which uses a microcrystalline semiconductor film. The signal line driver circuit 6023 is connected to the pixel portion 6022 via an FPC 6025. The pixel portion 6022, the signal line driver circuit 6023, and the scanning line driver circuit 6024 are each supplied with potential of a power source, a variety of signals, and the like via the FPC 6025.

Figure 10B:
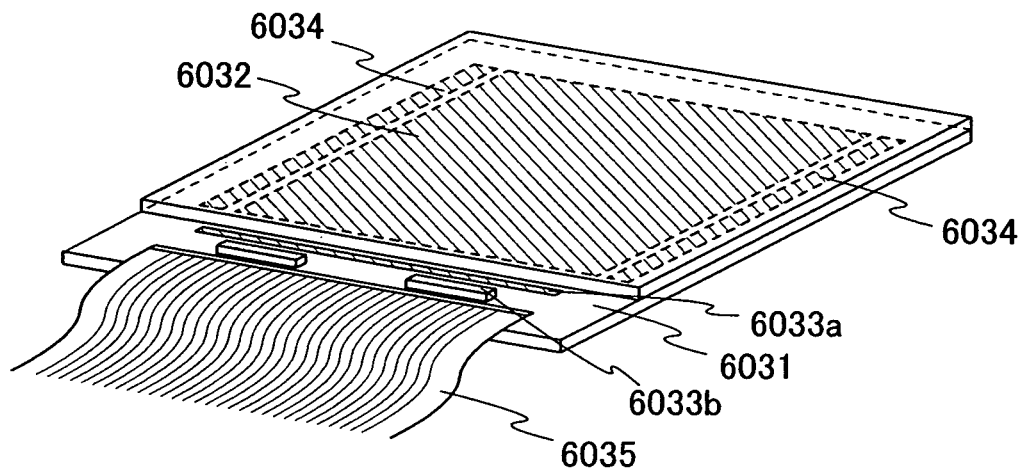

Also, part of the signal line driver circuit or part of the scanning line driver circuit may be formed over the same substrate as that of the pixel portion using the thin film transistor which uses a microcrystalline semiconductor film, and the rest may be formed separately and electrically connected to the pixel portion. FIG. 10B illustrates a mode of a display panel in which an analog switch 6033a included in the signal driver circuit is formed over a substrate 6031, over which a pixel portion 6032 and a scanning line driver circuit 6034 are formed, and a shift register 6033b included in the signal line driver circuit is formed over a different substrate separately and then attached to the substrate 6031. The pixel portion 6032 and the scanning line driver circuit 6034 are each formed using the thin film transistor which uses a microcrystalline semiconductor film. The shift register 6033b included in the signal line driver circuit is connected to the pixel portion 6032 via an FPC 6035. The pixel portion 6032, the signal line driver circuit, and the scanning line driver circuit 6034 are each supplied with potential of a power source, a variety of signals, and the like via the FPC 6035.

As illustrated in FIGS. 9 to 10B, in the display device of the present invention, an entire driver circuit or part thereof can be formed over the same substrate as that of a pixel portion, using the thin film transistor which uses a microcrystalline semiconductor film.

Note that there are no particular limitations on a connection method of a separately formed substrate, and a known method such as a COG method, a wire bonding method, or a TAB method can be used. Further, a connection position is not limited to the position illustrated in FIGS. 9 to 10B, as long as electrical connection is possible. Also, a controller, a CPU, a memory, or the like may be formed separately and connected.

Note that the signal line driver circuit used in the present invention is not limited to a mode including only a shift register and an analog switch. In addition to the shift register and the analog switch, another circuit such as a buffer, a level shifter, or a source follower may be included. Also, the shift register and the analog switch are not always required to be provided, and for example, a different circuit such as a decoder circuit by which selection of signal lines is possible may be used instead of the shift register, and a latch or the like may be used instead of the analog switch.

Figure 11A:
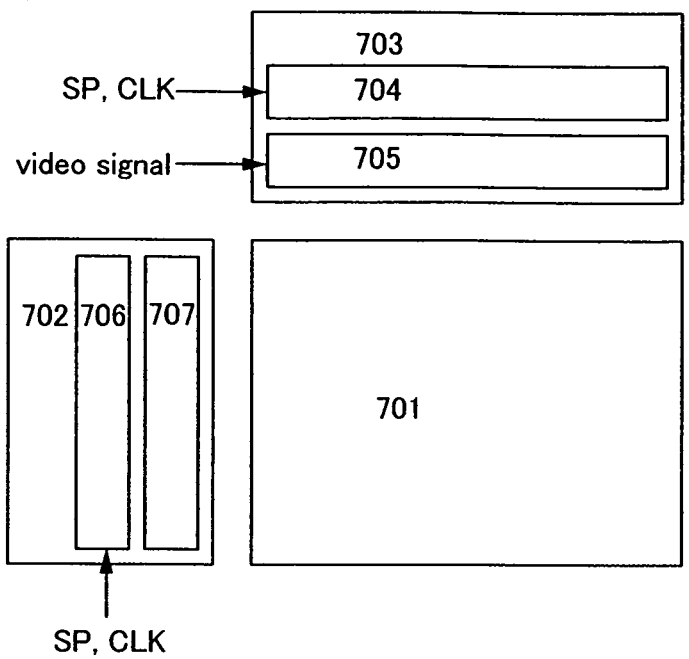
FIGS. 11A and 11B are explanatory block diagrams of configurations of a display device which can be applied to the present invention.

FIG. 11A illustrates a block diagram of a light-emitting device of the present invention. The light-emitting device illustrated in FIG. 11A includes a pixel portion 701 including a plurality of pixels each provided with a display element; a scanning line driver circuit 702 that selects each pixel; and a signal line driver circuit 703 that controls a video signal input to a selected pixel.

In FIG. 11A, the signal line driver circuit 703 includes a shift register 704 and an analog switch 705. To the shift register 704, a clock signal (CLK) and a start pulse signal (SP) are input. When the clock signal (CLK) and the start pulse signal (SP) are input, timing signals are generated in the shift register 704, and the timing signals are input to the analog switch 705.

Also, video signals are input to the analog switch 705. The analog switch 705 samples the video signals according to the input timing signals and distributes the video signals to signal lines.

Next, a configuration of the scanning line driver circuit 702 is described. The scanning line driver circuit 702 includes a shift register 706 and a buffer 707. Also, a level shifter may be included. In the scanning line driver circuit 702, by inputting a clock signal (CLK) and a start pulse signal (SP) to the shift register 706, a selection signal is generated. The generated selection signal is buffer-amplified in the buffer 707, and then supplied to a corresponding scanning line. To the scanning line, gates of transistors in pixels of one line are connected. Further, since the transistors in the pixels of one line have to be turned on at the same time, a buffer to which a large current can be fed is used for the buffer 707.

In a full color display device, when video signals corresponding to R (red), G (green), and B (blue) are sampled in sequence and are each supplied to a corresponding signal line, the number of terminals for connecting the shift register 704 and the analog switch 705 corresponds to about ⅓ of the number of terminals for connecting the analog switch 705 and the signal lines of the pixel portion 701. Consequently, by forming the analog switch 705 and the pixel portion 701 over the same substrate, the number of terminals used for connection can be suppressed compared to the case of forming the analog switch 705 and the pixel portion 701 over different substrates, and occurrence probability of poor connection can be suppressed, and the yield can be increased.

Figure 11B:
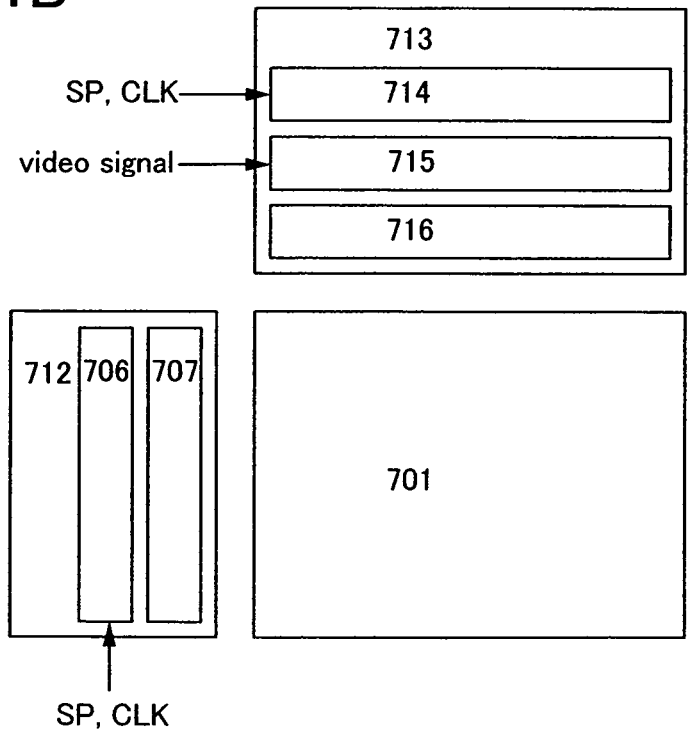

FIG. 11B shows a block diagram of a display device of the present invention that is different from that of FIG. 11A. In FIG. 11B, a signal line driver circuit 713 includes a shift register 714, a latch A 715, and a latch B 716. A scanning line driver circuit 712 is to have the same configuration as that of the scanning line driver circuit 702 in FIG. 11A.

To the shift register 714, a clock signal (CLK) and a start pulse signal (SP) are input. When the clock signal (CLK) and the start pulse signal (SP) are input, timing signals are generated in the shift register 714 to be input in sequence to the latch A 715 of a first stage. When the timing signals are input to the latch A 715, video signals are written in sequence to the latch A 715 in synchronism with the timing signals and retained. Note that in FIG. 11B, although it is assumed that the video signals are written to the latch A 715 in sequence, the present invention is not limited to this structure. A so-called division drive may be performed, in which plural stages of the latch A 715 are divided into several groups, and video signals are input to each group in parallel.

The time it takes for video signal-writing to all the latches of the latch A 715 to complete is called a line period. In practice, the line period sometimes includes a line period to which a horizontal retrace line period is added.

When one line period is completed, latch signals are supplied to the latch B 716 of a second stage, and the video signals retained in the latch A 715 are written to the latch B 716 all at once in synchronism with the latch signals, and retained. To the latch A 715 which has sent the video signals to the latch B 716, subsequent video signals are written in sequence in synchronism with timings signals from the shift register 714. In this second round of the one line period, the video signals written and retained in the latch B 716 are input to the signal lines.

Note that the configurations illustrated in FIGS. 11A and 11B are just modes of a display device of the present invention, and configurations of a signal line driver circuit and a scanning line driver circuit are not limited thereto.

Figure 13A:
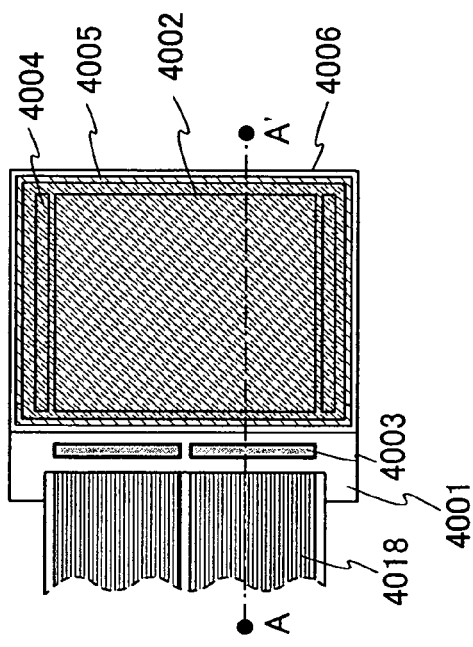
FIG. 13A is an explanatory top view and FIG. 13B is an explanatory cross-sectional view of a light-emitting display panel according to the present invention.

Then, an external view and a cross section of a light-emitting display panel which is one mode of the display device of the present invention will be described with reference to FIGS. 13A and 13B. FIG. 13A is a top view of a panel in which a thin film transistor using a microcrystalline semiconductor film and a light-emitting element which are formed over a first substrate are sealed between the first substrate and a second substrate with a sealant, and FIG. 13B corresponds to a cross-sectional view of a cross section taken along a line A-A' of FIG. 13A.

A sealant 4005 is provided so as to surround a pixel portion 4002 and a scanning line driver circuit 4004 which are provided over a first substrate 4001. A second substrate 4006 is provided over the pixel portion 4002 and the scanning line driver circuit 4004. Therefore, the pixel portion 4002 and the scanning line driver circuit 4004 as well as a filler 4007 are sealed between the first substrate 4001 and the second substrate 4006 with the sealant 4005. A signal line driver circuit 4003 formed over a substrate, which is prepared separately, using a polycrystalline semiconductor film is mounted at a region different from the region surrounded by the sealant 4005 over the first substrate 4001. This embodiment mode will explain an example of attaching the signal line driver circuit 4003 including a thin film transistor formed using a polycrystalline semiconductor film to the first substrate 4001. Alternatively, a signal line driver circuit including a thin film transistor, which is formed using a single-crystalline semiconductor film, may be attached to the first substrate 4001. FIG. 13B exemplifies a thin film transistor 4009 formed using a polycrystalline semiconductor film, which is included in the signal line driver circuit 4003.

The pixel portion 4002 and the scanning line driver circuit 4004 which are provided over the first substrate 4001 each include a plurality of thin film transistors. FIG. 13B exemplifies a thin film transistor 4010 included in the pixel portion 4002. In this embodiment mode, the thin film transistor 4010 is illustrated as a driving TFT but may also be a current control TFT or an erasing TFT. The thin film transistor 4010 corresponds to a thin film transistor which uses a microcrystalline semiconductor film.

In addition, a pixel electrode of a light-emitting element 4011 is electrically connected to a source or drain electrode of the thin film transistor 4010 through a wiring 4017. In this embodiment mode, a common electrode of the light-emitting element 4011 and a transparent conductive film 4012 are electrically connected to each other. Note that a structure of the light-emitting element 4011 is not limited to the structure described in this embodiment mode. The structure of the light-emitting element 4011 can be changed as appropriate in accordance with a direction of light taken from the light-emitting element 4011, polarity of the thin film transistor 4010, or the like.

Figure 13B:
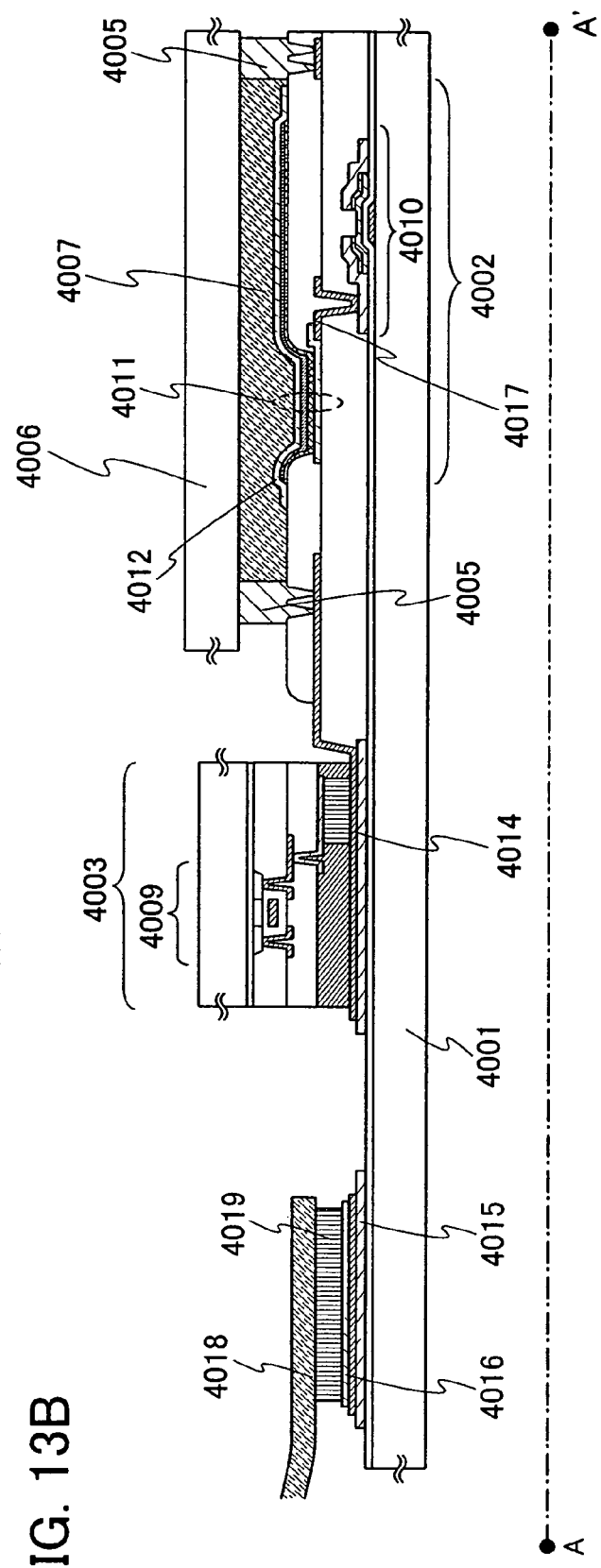

Although a variety of signals and potential which are applied to the signal line driver circuit 4003 which is formed separately, the scanning line driver circuit 4004, or the pixel portion 4002 are not illustrated in the cross-sectional view of FIG. 13B, the variety of signals and the potential are supplied from an FPC 4018 through a leading wiring 4014 and a leading wiring 4015.

In this embodiment mode, a connecting terminal 4016 is formed of the same conductive film as that of the pixel electrode included in the light-emitting element 4011. In addition, the leading wirings 4014 and 4015 are formed of the same conductive film as that of the wiring 4017.

The connecting terminal 4016 is electrically connected to a terminal included in the FPC 4018 through an anisotropic conductive film 4019.

Note that as the first substrate 4001 and the second substrate 4006, glass, metal (typically, stainless steel), ceramics, or plastic can be used. As for plastic, an FRP (fiberglass-reinforced plastics) plate, a PVF (polyvinyl fluoride) film, a polyester film, or an acrylic resin film can be used. In addition, a sheet with a structure in which an aluminum foil is sandwiched between PVF films or polyester films can be used.

Note that the second substrate in a direction to extract light from the light-emitting element 4011 needs to be transparent. In that case, a light-transmitting material such as a glass plate, a plastic plate, a polyester film, or an acrylic film is used.

As the filler 4007, an ultraviolet curable resin or a thermo-setting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. In this embodiment mode, nitrogen is used as the filler.

If necessary, a polarizing plate, a circularly polarizing plate (including an elliptically polarizing plate), a retardation plate (a quarter-wave plate or a half-wave plate), or an optical film such as a color filter may be provided as appropriate over a light-emitting surface of the light-emitting element. Further, a polarizing plate or a circularly polarizing plate may be provided with an anti-reflection film. For example, anti-glare treatment may be carried out by which reflected light can be diffused by projections and depressions on a surface so as to reduce reflection.

Note that FIGS. 13A and 13B illustrate an example in which the signal line driver circuit 4003 is formed separately and mounted on the first substrate 4001, but this embodiment mode is not limited to this structure. The scanning line driver circuit may be separately formed and then mounted, or only part of the signal line driver circuit or part of the scanning line driver circuit may be separately formed and then mounted.

Figure 14A:
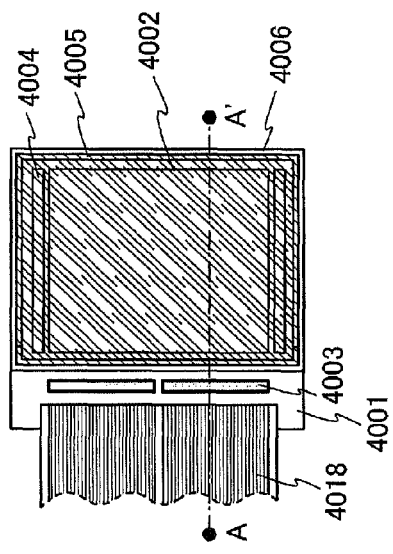
FIG. 14A is an explanatory top view and FIG. 14B is an explanatory cross-sectional view of a liquid crystal display panel according to the present invention.

Then, an external view and a cross section of a liquid crystal display panel which is one mode of the display device of the present invention will be described with reference to FIGS. 14A and 14B. FIG. 14A is a top view of the panel in which a thin film transistor 4010 including a microcrystalline semiconductor film and a liquid crystal element 4013 formed over a first substrate 4001 are sealed between a second substrate 4006 and a first substrate 4001 with a sealant 4005, and FIG. 14B is a cross-sectional view of a cross section taken along a line A-A' of FIG. 14A.

The sealant 4005 is provided to surround a pixel portion 4002 and a scanning line driver circuit 4004 that are formed over the first substrate 4001. The second substrate 4006 is provided over the pixel portion 4002 and the scanning line driver circuit 4004. Therefore, the pixel portion 4002 and the scanning line driver circuit 4004 are sealed, together with liquid crystal 4008, between the first substrate 4001 and the second substrate 4006 with the sealant 4005. A signal line driver circuit 4003 that is formed using a polycrystalline semiconductor film over a separately prepared substrate is mounted at a region that is different from the region surrounded by the sealant 4005 over the first substrate 4001. This embodiment mode will explain an example of attaching the signal line driver circuit 4003 including a thin film transistor formed using a polycrystalline semiconductor film to the first substrate 4001. Alternatively, a signal line driver circuit including a thin film transistor, which is formed using a single-crystalline semiconductor film, may be attached to the first substrate 4001. FIG. 14B exemplifies a thin film transistor 4009 formed using a polycrystalline semiconductor film, which is included in the signal line driver circuit 4003.

Figure 14B:
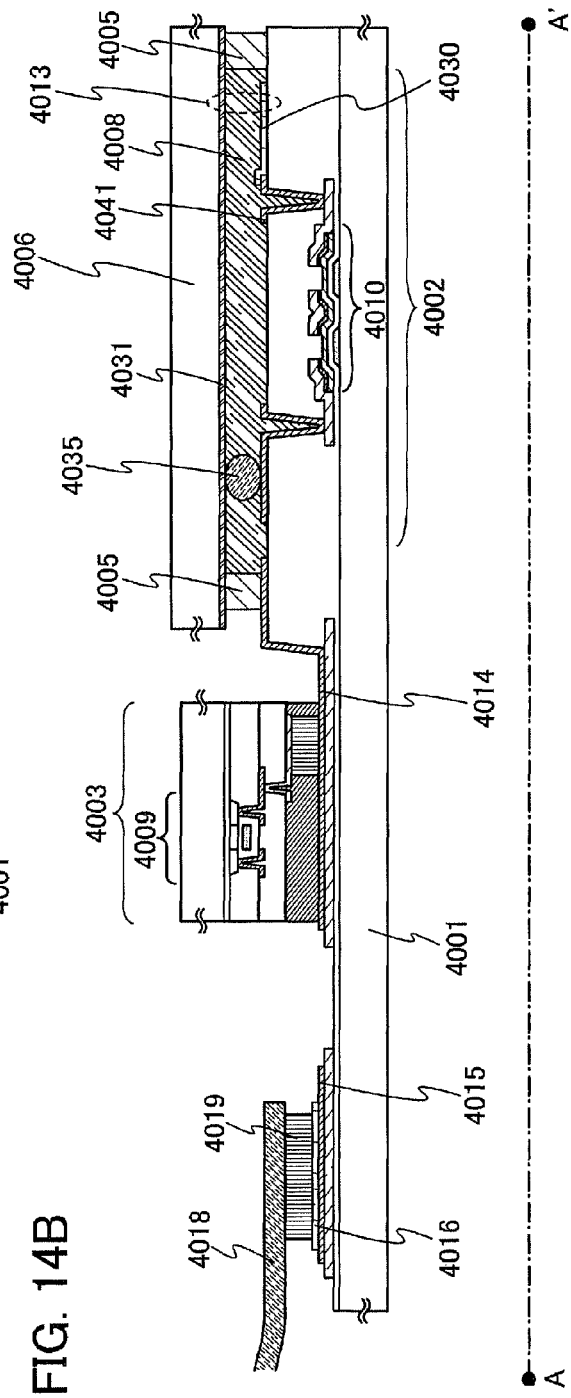

The pixel portion 4002 and the scanning line driver circuit 4004 formed over the first substrate 4001 each include a plurality of thin film transistors, and the thin film transistor 4010 included in the pixel portion 4002 is illustrated as an example in FIG. 14B. The thin film transistor 4010 corresponds to a thin film transistor using a microcrystalline semiconductor film.

In addition, a pixel electrode 4030 of a liquid crystal element 4013 is electrically connected to the thin film transistor 4010 through a wiring 4041. A counter electrode 4031 of the liquid crystal element 4013 is formed on the second substrate 4006. The liquid crystal element 4013 corresponds to a region where the pixel electrode 4030 and the counter electrode 4031 sandwich the liquid crystal 4008.

A spherical spacer 4035 is provided to control a distance (a cell gap) between the pixel electrode 4030 and the counter electrode 4031. A spacer which is obtained by patterning an insulating film may also be used.

A variety of signals and potential are supplied to the signal line driver circuit 4003 which is formed separately, the scanning line driver circuit 4004, or the pixel portion 4002 via leading wirings 4014 and 4015 from an FPC 4018.

In this embodiment mode, a connecting terminal 4016 is formed of the same conductive film as that of the pixel electrode 4030 included in the liquid crystal element 4013. In addition, the leading wirings 4014 and 4015 are formed of the same conductive film as that of the wiring 4041.

The connecting terminal 4016 is electrically connected to a terminal included in the FPC 4018 through an anisotropic conductive film 4019.

Although not illustrated, the liquid crystal display device shown in this embodiment mode includes an alignment film, a polarizing plate, and further, may include a color filter and a light-blocking film.

Note that FIGS. 14A and 14B illustrate an example in which the signal line driver circuit 4003 is formed separately and mounted on the first substrate 4001, but this embodiment mode is not limited to this structure. The scanning line driver circuit may be separately formed and then mounted, or only part of the signal line driver circuit or part of the scanning line driver circuit may be separately formed and then mounted.

This embodiment mode can be implemented in combination with the structures of other embodiment modes.

Embodiment Mode 4

Display devices such as liquid crystal display devices and light-emitting devices obtained according to the present invention can be used for a variety of modules (active matrix liquid crystal modules and active matrix EL modules). That is, the present invention can be implemented in all electronic devices in which these modules are incorporated into a display portion.

As those kinds of electronic devices, cameras such as video cameras and digital cameras; displays that can be mounted on a person's head (goggle-type displays); car navigation systems; projectors; car stereos; personal computers; portable information terminals (such as mobile computers, cellular phones, and electronic book readers); and the like can be given. Examples of these devices are illustrated in FIGS. 15A to 15C.

Figure 15A:
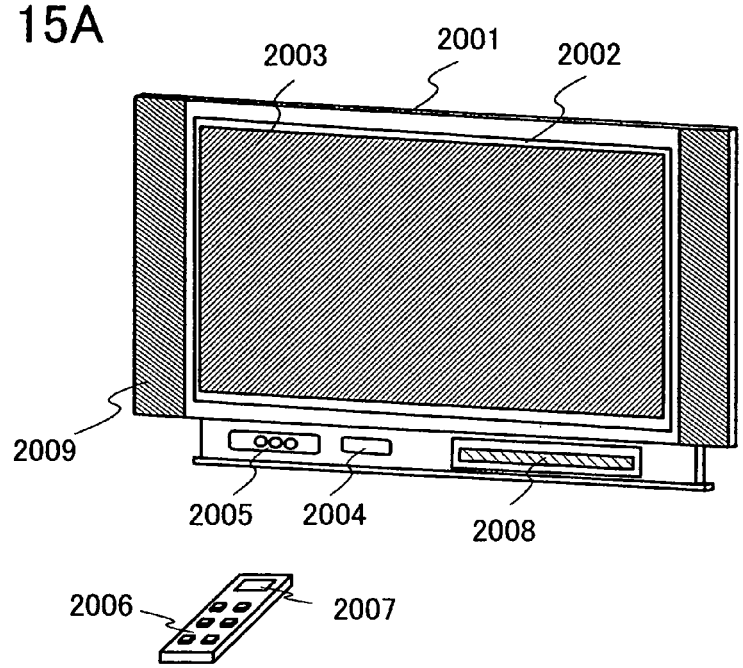
FIGS. 15A to 15C are explanatory perspective views of electronic devices using a display device according to the present invention.
Figure 15B:
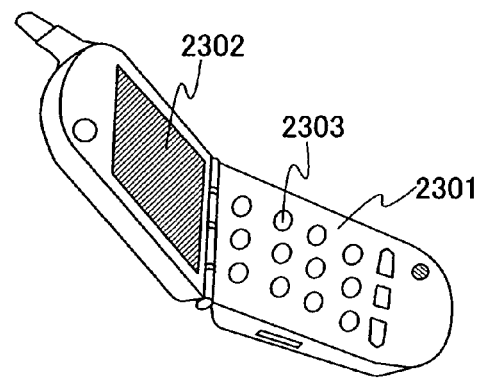
Figure 15C:
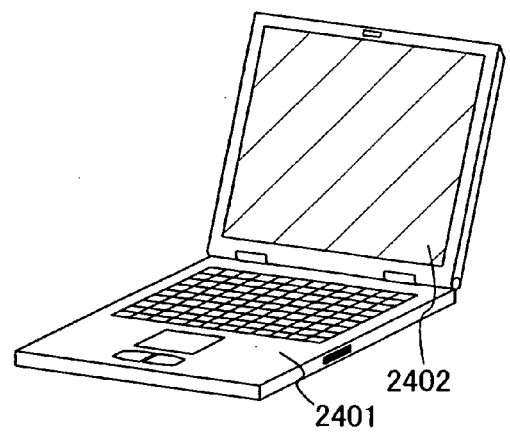

FIG. 15A illustrates a television device. A television device can be completed by incorporation of a display module into a chassis as illustrated in FIG. 15A. A display panel including components up to an FPC is also referred to as a display module. A main screen 2003 is formed with a display module, and speaker units 2009, operation switches, and the like are provided as accessory equipment. In this manner, a television device can be completed.

As illustrated in FIG. 15A, a display panel 2002 using display elements is incorporated into a chassis 2001, and in addition to reception of general television broadcast by a receiver 2005, communication of information in one direction (from a transmitter to a receiver) or in two directions (between a transmitter and a receiver or between receivers) can be performed by connection to a wired or wireless communication network via a modem 2004. Operations of the television device can be carried out using switches that are incorporated into the chassis or by a remote control device 2006 provided separately, and a display portion 2007 that displays information output to this remote control device may be provided for the remote control device.

Furthermore, in a television device, a sub-screen 2008 may be formed using a second display panel and used to display channel number, volume, and the like, in addition to the main screen 2003. In this structure, the main screen 2003 may be formed with a light-emitting display panel which has an excellent viewing angle, and the sub-screen 2008 may be formed with a liquid crystal display panel by which display at low power consumption is possible. In addition, in order to give priority to a shift toward lower power consumption, the structure may be set to be one in which the main screen 2003 is formed with a liquid crystal display panel, the sub-screen 2008 is formed with a light-emitting display panel, and the sub-screen is set to be turned on or off.

Needless to say, the present invention is not limited to being used in television devices and can be applied to a variety of applications such as monitors for personal computers and as display media that have a large area such as information display boards in railway stations, airports, and the like or street-side advertisement display boards.

FIG. 15B illustrates one mode of a cellular phone 2301. The cellular phone 2301 includes a display portion 2302, operation switches 2303, and the like. The display device described in the preceding embodiment modes is applied to the display portion 2302, so that mass productivity can be improved.

In addition, a portable computer illustrated in FIG. 15C includes a main body 2401, a display portion 2402, and the like. The display device described in the preceding embodiment modes is applied to the display portion 2402, so that mass productivity can be improved.

This application is based on Japanese Patent Application Serial No. 2007-147386 filed with Japan Patent Office on Jun. 1, 2007, the entire contents of which are hereby incorporated by reference.

What is claimed is:

1. A method for manufacturing a semiconductor device, comprising the steps of:
   introducing a non-source gas into a microwave plasma CVD apparatus;
   generating a plasma with the non-source gas by the microwave plasma CVD apparatus;
   introducing a source gas after generating the plasma; and forming a microcrystalline semiconductor film of a thin film transistor with the source gas by the microwave plasma CVD apparatus with a frequency of greater than or equal to 1 GHz, wherein the microwave plasma CVD apparatus is provided with a plurality of waveguides which is over a plurality of dielectric plates, wherein a first gas pipe and a second gas pipe are provided to intersect with each other between a substrate and the plurality of dielectric plates, wherein the non-source gas is released from an outlet of the first gas pipe provided on the plurality of dielectric plates side, and wherein the source gas is released from an outlet of the second gas pipe provided on the substrate side.

2. The method for manufacturing a semiconductor device according to claim 1, wherein the microcrystalline semiconductor film is used as at least a channel formation region of the thin film transistor.

3. The method for manufacturing a semiconductor device according to claim 1, wherein the microcrystalline semiconductor film is a microcrystalline silicon film.

4. A method for manufacturing a semiconductor device, comprising the steps of:

introducing a non-source gas into a microwave plasma CVD apparatus;

generating a plasma with the non-source gas by the microwave plasma CVD apparatus;

introducing a source gas after generating the plasma; and forming a microcrystalline semiconductor film of a thin film transistor with the source gas by the microwave plasma CVD apparatus with a frequency of greater than or equal to 1 GHz which is provided with a plurality of microwave generation units and a plurality of dielectric plates that propagates microwaves generated in the plurality of microwave generation units, wherein the microwave plasma CVD apparatus is provided with a plurality of waveguides which is over the plurality of dielectric plates, wherein a first gas pipe and a second gas pipe are provided to intersect with each other between a substrate and the plurality of dielectric plates, wherein the non-source gas is released from an outlet of the first gas pipe provided on the plurality of dielectric plates side, and wherein the source gas is released from an outlet of the second gas pipe provided on the substrate side.

5. The method for manufacturing a semiconductor device according to claim 4, wherein the microcrystalline semiconductor film is used as at least a channel formation region of the thin film transistor.

6. The method for manufacturing a semiconductor device according to claim 4, wherein the microcrystalline semiconductor film is a microcrystalline silicon film.

7. A method for manufacturing a display device, comprising the steps of:

forming a gate electrode over a substrate;

forming a gate insulating film over the gate electrode;

introducing a non-source gas into a microwave plasma CVD apparatus;

generating a plasma with the non-source gas by the microwave plasma CVD apparatus;

introducing a source gas after generating the plasma;

forming a microcrystalline semiconductor film with the source gas over the gate insulating film;

forming a semiconductor film to which an impurity element imparting one conductivity type is added over the microcrystalline semiconductor film;

etching the microcrystalline semiconductor film and the semiconductor film to which the impurity element imparting one conductivity type is added, to form an island shape microcrystalline semiconductor film functioning as a channel formation region and an island shape semiconductor film to which the impurity element imparting one conductivity type is added;

forming a source electrode and a drain electrode over the island shape semiconductor film to which the impurity element imparting one conductivity type is added;

etching the island shape semiconductor film to which the impurity element imparting one conductivity type is added using the source electrode and the drain electrode as masks, to divide into a source region and a drain region; and forming a pixel electrode in contact with the source electrode or the drain electrode, wherein the microcrystalline semiconductor film and the semiconductor film to which the impurity element imparting one conductivity type is added are formed by the microwave plasma CVD apparatus with a frequency of greater than or equal to 1 GHz which is provided with a plurality of microwave generation units and a plurality of dielectric plates that propagates microwaves generated in the plurality of microwave generation units, wherein the microwave plasma CVD apparatus is provided with a plurality of waveguides which is over the plurality of dielectric plates, wherein a first gas pipe and a second gas pipe are provided to intersect with each other between the substrate and the plurality of dielectric plates, wherein the non-source gas is released from an outlet of the first gas pipe provided on the plurality of dielectric plates side, and wherein the source gas is released from an outlet of the second gas pipe provided on the substrate side.

8. The method for manufacturing a display device according to claim 7, wherein the microcrystalline semiconductor film is microcrystalline silicon film.

9. The method for manufacturing a display device according to claim 7, wherein the display device is a liquid crystal display device.

10. The method for manufacturing a display device according to claim 7, wherein the display device is a light-emitting device.

11. A method for manufacturing a display device, comprising the steps of:

forming a gate electrode over a substrate;

forming a gate insulating film over the gate electrode;

introducing a non-source gas into a microwave plasma CVD apparatus;

generating a plasma with the non-source gas by the microwave plasma CVD apparatus;

introducing a source gas after generating the plasma;

forming a microcrystalline semiconductor film with the source gas over the gate insulating film;

forming a channel protective film over the microcrystalline semiconductor film;

forming a semiconductor film to which an impurity element imparting one conductivity type is added, over the microcrystalline semiconductor film and the channel protective film;

etching the microcrystalline semiconductor film and the semiconductor film to which the impurity element imparting one conductivity type is added, to form an island shape microcrystalline semiconductor film functioning as a channel formation region and an island shape semiconductor film to which the impurity element imparting one conductivity type is added;

forming a source electrode and a drain electrode over the island shape semiconductor film to which the impurity element imparting one conductivity type is added;

etching the island shape semiconductor film to which the impurity element imparting one conductivity type is added using the source electrode and the drain electrode as masks, to divide into a source region and a drain region; and forming a pixel electrode in contact with the source electrode or the drain electrode, wherein the microcrystalline semiconductor film and the semiconductor film to which the impurity element imparting one conductivity type is added are formed by the microwave plasma CVD apparatus with a frequency of greater than or equal to 1 GHz which is provided with a plurality of microwave generation units and a plurality of dielectric plates that propagates microwaves generated in the plurality of microwave generation units, wherein the microwave plasma CVD apparatus is provided with a plurality of waveguides which is over the plurality of dielectric plates, wherein a first gas pipe and a second gas pipe are provided to intersect with each other between the substrate and the plurality of dielectric plates, wherein the non-source gas is released from an outlet of the first gas pipe provided on the plurality of dielectric plates side, and wherein the source gas is released from an outlet of the second gas pipe provided on the substrate side.

12. The method for manufacturing a display device according to claim 11, wherein the microcrystalline semiconductor film is microcrystalline silicon film.

13. The method for manufacturing a display device according to claim 11, wherein the display device is a liquid crystal display device.

14. The method for manufacturing a display device according to claim 11, wherein the display device is a light-emitting device.

15. The method for manufacturing a semiconductor device according to claim 1, wherein the microcrystalline semiconductor film is formed by using the source gas including at least one of $SiH_4$, $Si_2H_6$, $SiCl_4$, and $SiF_4$.

16. The method for manufacturing a semiconductor device according to claim 4, wherein the microcrystalline semiconductor film is formed by using the source gas including at least one of $SiH_4$, $Si_2H_6$, $SiCl_4$, and $SiF_4$.

17. The method for manufacturing a display device according to claim 7, wherein the microcrystalline semiconductor film is formed by using the source gas including at least one of $SiH_4$, $Si_2H_6$, $SiCl_4$, and $SiF_4$.

18. The method for manufacturing a display device according to claim 11, wherein the microcrystalline semiconductor film is formed by using the source gas including at least one of $SiH_4$, $Si_2H_6$, $SiCl_4$, and $SiF_4$.

19. The method for manufacturing a semiconductor device according to claim 1, wherein the non-source gas is a rare gas selected from the group consisting of helium, argon, xenon, and krypton.

20. The method for manufacturing a semiconductor device according to claim 4, wherein the non-source gas is a rare gas selected from the group consisting of helium, argon, xenon, and krypton.

21. The method for manufacturing a display device according to claim 7, wherein the non-source gas is a rare gas selected from the group consisting of helium, argon, xenon, and krypton.

22. The method for manufacturing a display device according to claim 11, wherein the non-source gas is a rare gas selected from the group consisting of helium, argon, xenon, and krypton.

23. The method for manufacturing a display device according to claim 7, wherein the gate insulating film is formed by the microwave plasma CVD apparatus with a frequency of greater than or equal to 1 GHz.

24. The method for manufacturing a display device according to claim 11, wherein the gate insulating film is formed by the microwave plasma CVD apparatus with a frequency of greater than or equal to 1 GHz.

* * * * *